United States Patent
Yasumori et al.

(10) Patent No.: US 8,569,835 B2
(45) Date of Patent: Oct. 29, 2013

(54) SEMICONDUCTOR DEVICE

(75) Inventors: Koji Yasumori, Tokyo (JP); Hisayuki Nagamine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 382 days.

(21) Appl. No.: 12/913,022

(22) Filed: Oct. 27, 2010

(65) Prior Publication Data

US 2011/0102955 A1    May 5, 2011

(30) Foreign Application Priority Data

Oct. 30, 2009  (JP) ................................. 2009-250345

(51) Int. Cl.
  *H01L 23/62* (2006.01)
  *G03G 15/02* (2006.01)
  *G11C 11/24* (2006.01)

(52) U.S. Cl.
  USPC ............ 257/355; 257/774; 361/235; 365/149

(58) Field of Classification Search
  USPC .................... 257/355, 774; 361/235; 365/149
  See application file for complete search history.

(56) References Cited

U.S. PATENT DOCUMENTS

| | | | | |
|---|---|---|---|---|
| 7,304,345 B2 * | 12/2007 | Adachi et al. | ................. | 257/316 |
| 7,480,168 B2 * | 1/2009 | Arimoto et al. | ............... | 365/149 |
| 7,528,036 B2 * | 5/2009 | Adachi et al. | ................. | 438/258 |
| 2009/0230453 A1 * | 9/2009 | Adachi et al. | ................. | 257/316 |

FOREIGN PATENT DOCUMENTS

JP    2001-027401    2/2007

* cited by examiner

*Primary Examiner* — Long K Tran
(74) *Attorney, Agent, or Firm* — Young & Thompson

(57) ABSTRACT

A semiconductor device includes a first pad, and a sub-trunk line elongated in a first direction; a main-trunk line arranged between the first pad and the sub-trunk line and elongated in the first direction. The semiconductor device further includes a first plug line elongated in a second direction crossing the first direction, the first plug line being connected between the first pad and the main-trunk line without being direct contact with the sub-trunk line. The semiconductor device further includes a second plug line elongated in the second direction, the second plug line being connected between the main-trunk line and the sub-trunk line, and a first element coupled to the sub-trunk line.

13 Claims, 15 Drawing Sheets

SEMICONDUCTOR DEVICE

BACKGROUND OF THE INVENTION

1. Field of the Invention

The present invention relates to a wiring structure between a plurality of pads and a plurality of internal circuits, and more particularly, to electrostatic discharge breakdown of an internal element in the wiring structure.

Priority is claimed on Japanese Patent Application No. 2009-250345, filed Oct. 30, 2009, the content of which is incorporated herein by reference.

2. Description of the Related Art

Japanese Unexamined Patent Application, First Publication, No. 2007-27401 discloses a wiring structure of power supply wirings which connect a plurality of power supply pads to a plurality of internal circuits in a semiconductor device, and discloses an effective wiring structure for preventing a power supply voltage supplied to an internal circuit from being dropped due to parasitic resistance of a power supply wiring and preventing a ground voltage from being raised.

In a general semiconductor device, a protection circuit for protecting an internal circuit from electrostatic discharge breakdown when an external overvoltage is applied to a power supply pad or an IO pad is provided around the power supply pad or the IO pad.

However, no protection circuit is disclosed in Japanese Unexamined Patent Application, First Publication, No. 2007-27401.

SUMMARY

In one embodiment, a semiconductor device may include, but is not limited to, a first pad; a sub-trunk line elongated in a first direction; a main-trunk line arranged between the first pad and the sub-trunk line and elongated in the first direction; a first plug line elongated in a second direction crossing the first direction, the first plug line being connected between the first pad and the main-trunk line without being direct contact with the sub-trunk line; a second plug line elongated in the second direction, the second plug line being connected between the main-trunk line and the sub-trunk line; and a first element coupled to the sub-trunk line.

In another embodiment, a semiconductor device may include, but is not limited to, first and second pads arranged in a first direction; a first cell region being elongated in the first direction; a second cell region arranged between the first and second pads and the first cell region, the second cell region being elongated in the first direction; a sub-trunk line formed in the first cell region, the sub-trunk line being elongated in the first direction; a main-trunk line formed in the second cell region, the main-trunk line being elongated in the first direction; a first plug line connecting the first pad to the main-trunk line at a first connecting point on the main-trunk line; a second plug line connecting the second pad to the main-trunk line at a second connecting point on the main-trunk line, the second connecting point being distanced from the first connecting point; and a third plug line connecting the sub-trunk line to the main-trunk line at a third connecting point on the main-trunk line, the third connecting point being positioned between the first connecting point and the second connecting point, the third connecting point being distanced from the first connecting point and from the second connecting point, wherein each of the first and second connecting points is connected through the third plug line to the sub-trunk line.

In still another embodiment, a semiconductor device may include, but is not limited to, a first pad; a first cell region including a first element that has a first voltage resisting characteristic, the first cell region being elongated in a first direction; a second cell region arranged between the first pad and the first cell region, the second cell region including a second element that has a second voltage resisting characteristic, the second voltage resisting characteristic being higher in voltage level than the first voltage resisting characteristic, the second cell region being elongated in the first direction; and a sub-trunk line formed in the first cell region, the sub-trunk line being elongated in the first direction, the sub-trunk line supplying a potential to the first element, the potential having been supplied from the first pad; wherein a path from the first pad to the sub-trunk line is greater in length than a shortest distance between the first pad and the sub-trunk line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing embodiments of the present invention, the related art will be explained in detail with reference to FIGS. 12, 13A, 13B, 14 and 15, in order to facilitate the understanding of embodiments of the present invention.

Figure 12:
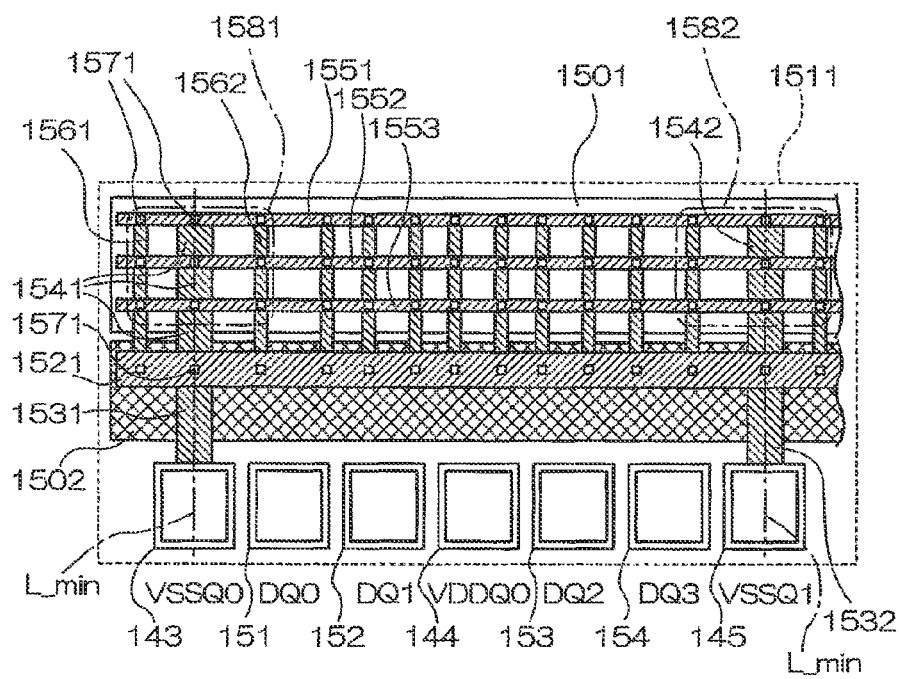
FIG. 12 is a schematic plan view illustrating a configuration of a data-system peripheral circuit region in the related art.

In general, a protection circuit arranged in a semiconductor device having power supply wirings for internal circuits arranged in a mesh shape as disclosed in Patent Document 1 will be described with reference to FIGS. 12 to 15. FIG. 12 is a plan view schematically showing the configuration of a data-system peripheral circuit arrangement region within a semiconductor memory device as an example of the semiconductor device having power supply wirings for internal circuits arranged in the mesh shape. In FIG. 12, a data-system peripheral circuit arrangement region 1511 is shown with four data input/output terminals DQ0 to DQ3 as one unit. In this case, the data-system peripheral circuit arrangement region 1511 includes a VSSQ0 pad 143 for inputting (applying) a ground potential VSSQ of a data system, a VDDQ0 pad 144 for inputting (applying) a power supply potential VDDQ of the data system, and a VSSQ1 pad 145 for inputting the ground potential VSSQ of the data system (hereinafter, collectively referred to as power supply pads), and a DQ0 pad 151, a DQ1 pad 152, a DQ2 pad 153, and a DQ3 pad 154 for inputting/outputting data (hereinafter, collectively referred to as DQ pads). The data-system peripheral circuit arrangement region 1511 includes two regions: a cell arrangement region 1 (1501) and a cell region 2 (1502), which differ in specifications, such as voltage resisting characteristic properties of circuits.

In the cell region 1 (1501), a cell group (an output control unit, a level shift unit, an input buffer, compensation capacitance and the like) using a low voltage element (or electrostatic discharge (ESD) voltage resisting characteristic) (an element of which a maximum rated voltage is relatively low) is arranged. In the cell region 2 (1502), a cell group (a power supply protection element, an input protection element, an output buffer, and the like) using a high voltage element (an element of which a maximum rated voltage is relatively high) is arranged.

In the cell region 2 (1502), a VSSQ main trunk line 1521 connected to the VSSQ0 pad 143 and the VSSQ1 pad 145 (hereinafter, collectively referred to as VSSQ pads) via VSSQ plug lines 1531 and 1532 is arranged. The VSSQ main trunk line 1521 is connected to VSSQ sub-trunk lines 1551, 1552, and 1553 in the cell region 1 (1501) via VSSQ plug lines 1541, 1542, 1561, 1562, and the like. The VSSQ sub-trunk lines 1551, 1552, and 1553 (hereinafter, referred to as power supply sub-trunk lines) are power supply lines which supply the ground potential to respective elements within the cell region 1 (1501).

In FIG. 12, parts of the VSSQ sub-trunk lines 1551, 1552 and 1553 and the VSSQ plug lines 1541 and 1542, and the VSSQ plug lines 1561 and 1562 form VSSQ power supply wirings in the mesh shape.

The VSSQ plug lines 1541 and 1542 are formed integrally with the VSSQ plug lines 1531 and 1532 connecting between the VSSQ pads 143 and 145 and the VSSQ main trunk line 1521 by linearly extending the VSSQ plug lines 1531 and 1532 in the same wiring width. As described above, in the semiconductor memory device shown in FIG. 12, the VSSQ main trunk line 1521 and the VSSQ sub-trunk lines 1551 to 1553 are connected to the VSSQ pads 143 and 145 by common plug lines (a combination of the wirings 1531 and 1541 and a combination of the wirings 1532 and 1542). The common plug lines (the combination of the wirings 1531 and 1541 and the combination of the wirings 1532 and 1542) are arranged on straight lines L_min reaching from the VSSQ pads 143 and 145 to the VSSQ main trunk line 1521 and the VSSQ sub-trunk lines 1551 to 1553 at the shortest distance.

The VSSQ main trunk line 1521 and the VSSQ sub-trunk lines 1551 to 1553 are wirings formed on a wiring layer different from that of the VSSQ plug lines 1531, 1532, 1541, 1542, 1561, 1562, and the like, and are connected to the VSSQ plug lines 1531, 1532, 1541, 1542, 1561, 1562, and the like via a plurality of contact holes 1571. In this application, the main trunk line refers to a trunk line connecting between power supply pads (a trunk line connecting between the VSSQ0 pad 143 and the VSSQ1 pad 145 in this example), and the sub-trunk line refers to a trunk line separated from the main trunk line.

Figure 13A:
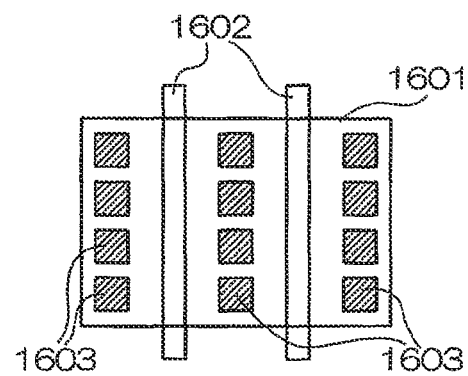
FIG. 13A is a schematic plan view illustrating an layout of low voltage elements and high voltage elements.
Figure 13B:
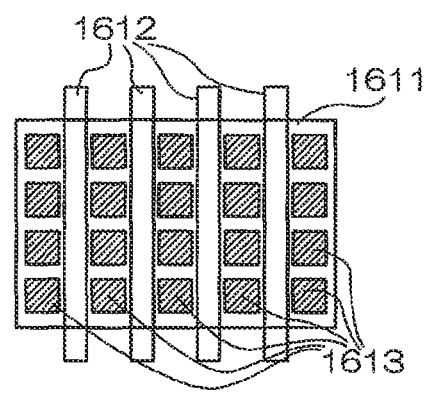
FIG. 13B is a schematic plan view illustrating another layout of low voltage elements and high voltage elements.

FIGS. 13A and 13B show planar structures of an high voltage element included in the cell region 2 (1502) of FIG. 12 (FIG. 13A) and an low voltage element included in the cell region 1 (1501) (FIG. 13B). In the high voltage element shown in FIG. 13A, the spacing between a gate 1602 and a contact 1603 formed on a diffusion layer 1601 is designed to be relatively wide and the element density is relatively sparse. The high voltage element shown in FIG. 13A is connected to the VSSQ main trunk line 1521 and the like within the cell region 2 (1502), and is used as a power supply protection element, an input protection element, and an output buffer arranged in the cell region 2 (1502). On the other hand, in the low voltage element shown in FIG. 13B, the spacing between a gate 1612 and a contact 1613 formed on a diffusion layer 1611 is designed to be relatively narrow and the element density is relatively dense. The low voltage element shown in FIG. 13B is connected to the VSSQ sub-trunk lines 1551 to 1553 and the like within the cell region 1 (1501) of FIG. 12, and is used as internal elements (an output control unit, a level shift unit, an input buffer, compensation capacitance, and the like) arranged in the cell region 1 (1501).

Figure 14:
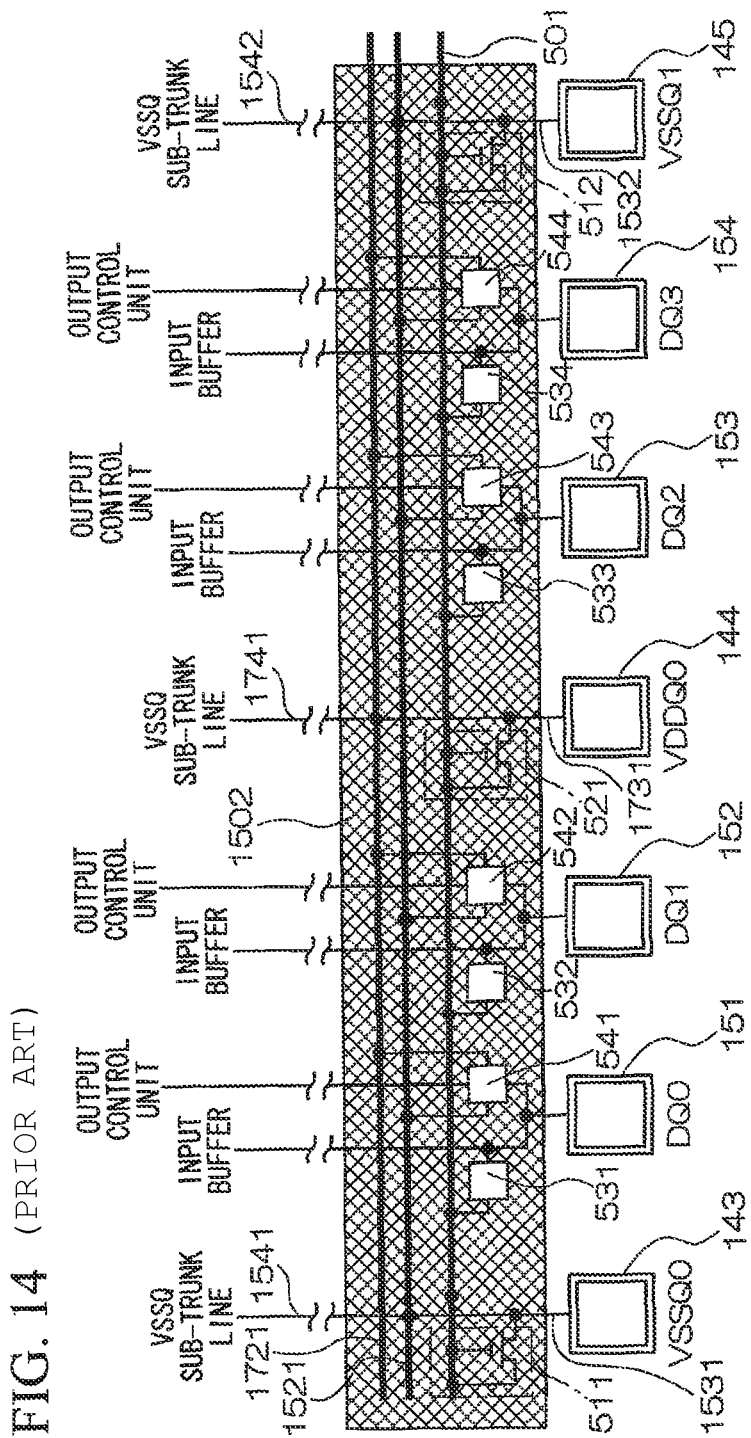
FIG. 14 is a diagram illustrating a circuit layout near a cell region in FIG. 12.

FIG. 14 is a diagram showing a circuit arrangement around the cell region 2 (1502) of FIG. 12. The same elements as shown in FIG. 12 are denoted by the same reference numerals. In FIG. 14, in the cell region 2 (1502), a VDDQ main trunk line 1721, a common discharge line 501, VDDQ plug lines 1731 and 1741, power supply protection elements 511, 512, and 521, input protection elements 531, 532, 533, and 534, and output buffers 541, 542, 543, and 544 are arranged in addition to those shown in FIG. 12.

The VDDQ main trunk line 1721 is connected to the VDDQ0 pad 144 by the VDDQ plug line 1731, and is further connected to a VDDQ sub-trunk line (not shown) within the cell region 1 (1501) by the VDDQ plug line 1741. The VDDQ sub-trunk line is a power supply line arranged within the cell region 1 (1501) like the VSSQ sub-trunk lines 1551, 1552, and 1553, for supplying a power supply potential to respective elements within the cell region 1 (1501).

The common discharge line 501 is connected to the VSSQ0 pad 143 via the power supply protection element 511, connected to the VSSQ1 pad 145 via the power supply protection element 512, connected to the VDDQ0 pad 144 via the power supply protection element 521, and connected to the DQ0 pad 151, the DQ1 pad 152, the DQ2 pad 153, and the DQ3 pad 154 via the input protection elements 531, 532, 533, and 544. The common discharge line 501 is a trunk line used to discharge an overvoltage such as static electricity from the VSSQ0 pad 143 or the VSSQ1 pad 145 when the overvoltage is applied to each pad. A ground potential from a power supply pad (not shown) is supplied to the common discharge line 501.

When an overvoltage such as static electricity is applied to any one of the VSSQ0 pad 143, the VSSQ1 pad 145, the VDDQ0 pad 144, and the DQ pad, the power supply protection elements 511 and 512 are in a conductive state, and discharge the overvoltage applied to the VSSQ0 pad 143 or the VSSQ1 pad 145 from another VSSQ via the common discharge line 501. Specifically, for example, the overvoltage is discharged from the VDDQ0 pad 144 when the overvoltage is applied to the VSSQ0 pad 143, and the overvoltage is discharged from the VSSQ pad 143 when the overvoltage is applied to the VDDQ0 pad 144. When an overvoltage such as static electricity is applied to the VDDQ0 pad 144, the power supply protection element 521 discharges the overvoltage from the VSSQ0 pad 143 or the VSSQ1 pad 145 via the common discharge line 501.

The input protection elements 531, 532, 533, and 534 are connected between the DQ0 pad 151, the DQ1 pad 152, the DQ2 pad 153, and the DQ3 pad 154 and input buffers (not shown) within the cell region 1 (1501), and discharge an overvoltage such as static electricity from the VSSQ0 pad 143 or the VSSQ1 pad 145 via the common discharge line 501 and the power supply protection elements 511 and 512 when the overvoltage is applied to the respective DQ pads 151 to 154.

The output buffers 541, 542, 543, and 544 are connected between the DQ0 pad 151, the DQ1 pad 152, the DQ2 pad 153, and the DQ3 pad 154 and an output control unit (not shown) within the cell region 1 (1501), and are operated using a voltage between the VSSQ main trunk line 1521 and the VDDQ main trunk line 1721 as a power supply voltage.

Figure 15:
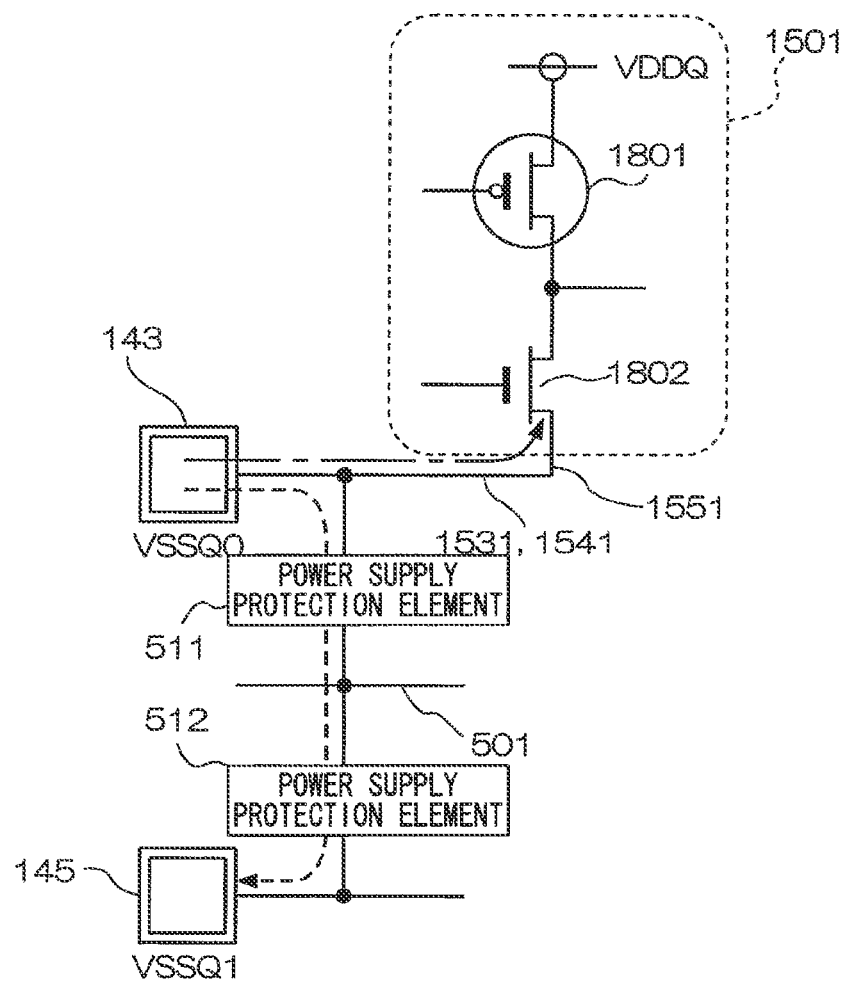
FIG. 15 is a circuit diagram illustrating operations of the semiconductor device of FIG. 12 when an overvoltage is applied.

FIG. 15 is a conceptual diagram illustrating an operation when an overvoltage is applied to the VSSQ0 pad 143 shown in FIG. 14. When the power supply protection elements 511 and 512 function normally, that is, are in the conductive state, an abnormal potential applied to the VSSQ0 pad 143 is discharged to another VSSQ pad—the VSSQ1 pad 145—along a path indicated by a dashed arrow via the power supply protection element 511, the common discharge line 501, and the power supply protection element 512. Thus, when the power supply protection elements 511 and 512 function normally, that is, are in the conductive state, the overvoltage is not applied to an internal element (low voltage element) 1802 in the cell region 1 (1501) and the internal element (low voltage element) 1802 is not subjected to electrostatic breakdown.

However, a given time dependent on, for example, characteristics of power supply protection elements (for example, the power supply protection elements 511 and 512) is necessary for the conductive state of the power supply protection elements. Accordingly, when the resistances of VSSQ plug lines (for example, the VSSQ plug lines 1531 and 1541) or VDDQ plug lines (for example, the VDDQ plug lines 1731 and 1741) become low and the time constants of the plug lines become small, an overvoltage may be applied to an internal element (particularly, an internal element within a range 1581 or 1582 around the VSSQ plug line 1541 or 1542 indicated by a dashed dotted line in FIG. 12) connected to a sub-trunk line (for example, the VSSQ sub-trunk line 1551) within the cell region 1 (1501). In other words, before the power supply protection elements 511 and 512 in FIG. 15 are in the conductive state, an overvoltage may be applied to the internal element (low voltage element) 1802 within the cell region 1 (1501) along a path indicated by a dashed dotted arrow in FIG. 15. Since the internal element within the cell region 1 (1501) is a low voltage element, the internal element is subjected to electrostatic breakdown when an overvoltage is applied.

Recently, a chip size of a semiconductor memory device has been reduced, and the reduced chip size has led to small lengths of the plug lines 1531 and 1541, 1532 and 1542, or the like between the VSSQ pad 143 or 145 and an internal element (low voltage element) arranged in the cell region 1 (1501) and a small resistance value between the VSSQ pad 143 or 145 and the element arranged in the cell region 1 (1501). Thus, when an overvoltage such as static electricity is applied to any of the VSSQ pads 143 and 145 and the VDDQ pad 144, the internal element in the cell region 1 (1501) may be subjected to electrostatic discharge breakdown by the overvoltage transferred to the internal element before the power supply protection elements 511, 512, and 521 are in the conductive state. Here, an example of VSSQ has been described, but the same problem occurs even in VDDQ.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first pad; a sub-trunk line elongated in a first direction; a main-trunk line arranged between the first pad and the sub-trunk line and elongated in the first direction; a first plug line elongated in a second direction crossing the first direction, the first plug line being connected between the first pad and the main-trunk line without being direct contact with the sub-trunk line; a second plug line elongated in the second direction, the second plug line being connected between the main-trunk line and the sub-trunk line; and a first element coupled to the sub-trunk line.

In some cases, the first element may be arranged at a position substantially on a line extending from the first plug line, and the first element is free from a contact to the first plug line.

In some cases, the semiconductor device may further include, but is not limited to, a common discharge line connected to the first plug line, and a protection element connected between the first plug line and the common discharge line.

In some cases, a time constant of a first path from the first pad to the first element is greater than a time period from receiving an overvoltage to discharging the overvoltage through the protection element and the common discharge line.

In some cases, when an overvoltage is received at the first pad, the overvoltage is discharged through the protection element to the common discharge line without being supplied to the first element.

In some cases, the semiconductor device may further include, but is not limited to, a first cell region including the sub-trunk line; a second cell region formed between the first pad and the first cell region, the second cell region including the main-trunk line, the second cell region including first and second portions that are arranged in parallel to the first direction; a third cell region formed between the first and second portions of the second cell region; a third plug line elongated in the second direction and connected to the sub-trunk line; and a second element formed in the third cell region, the second element being coupled to the third plug line, the second element being free from a contact to the main-trunk line and to the first plug line.

In some cases, the semiconductor device may further include, but is not limited to, a second pad aligned to the first pad in a first direction; a fourth cell region formed between the first pad and the second pad; a fourth plug line elongated in the second direction and connected to the sub-trunk line; and a third element formed in the fourth cell region, the third element being coupled to the third plug line, the third element being free from a contact to the main-trunk line and to the first plug line.

In some cases, the first pad comprises one of a power pad and a ground pad.

In some cases, the semiconductor device may further include, but is not limited to, a first conductive layer and a second conductive layer formed above the first conductive layer. The sub-trunk line and the main-trunk line are formed on the second conductive layer and the first plug line and the second plug line are formed on the first conductive layer.

In some cases, the first conductive layer is lower in conductivity than the second conductive layer.

In another embodiment, a semiconductor device may include, but is not limited to, first and second pads arranged in a first direction; a first cell region being elongated in the first direction; a second cell region arranged between the first and second pads and the first cell region, the second cell region being elongated in the first direction; a sub-trunk line formed in the first cell region, the sub-trunk line being elongated in the first direction; a main-trunk line formed in the second cell region, the main-trunk line being elongated in the first direction; a first plug line connecting the first pad to the main-trunk line at a first connecting point on the main-trunk line; a second plug line connecting the second pad to the main-trunk line at a second connecting point on the main-trunk line, the second connecting point being distanced from the first connecting point; and a third plug line connecting the sub-trunk line to the main-trunk line at a third connecting point on the main-trunk line, the third connecting point being positioned between the first connecting point and the second connecting point, the third connecting point being distanced from the first connecting point and from the second connecting point, wherein each of the first and second connecting points is connected through the third plug line to the sub-trunk line.

In some cases, each of the first and second connecting points is connected to the sub-trunk line at a non-shortest distance.

In some cases, a first length of the main-trunk line, being defined between the first connecting point and the third connecting point, is substantially equal in length to a second length of the main-trunk line, being defined between the second connecting point and the third connecting point.

In some cases, the semiconductor device may further include, but is not limited to, a plurality of third pads between the first pad and the second pad, and wherein the first and second pads are one of a power pad and a ground pad, and the third pad is a signal pad.

In still another embodiment, a semiconductor device may include, but is not limited to, a first pad; a first cell region including a first element that has a first voltage resisting characteristic, the first cell region being elongated in a first direction; a second cell region arranged between the first pad and the first cell region, the second cell region including a second element that has a second voltage resisting characteristic, the second voltage resisting characteristic being higher in voltage level than the first voltage resisting characteristic, the second cell region being elongated in the first direction; and a sub-trunk line formed in the first cell region, the sub-trunk line being elongated in the first direction, the sub-trunk line supplying a potential to the first element, the potential having been supplied from the first pad; wherein a path from the first pad to the sub-trunk line is greater in length than a shortest distance between the first pad and the sub-trunk line.

In some cases, the semiconductor device may further include, but is not limited to a plurality of additional sub-trunk lines in the first cell region.

In some cases, the second cell region may include, but is not limited to, a plurality of sub-second-cell-regions that are separated from each other. The semiconductor device further may include, but is not limited to, a third cell region which isolates the sub-second-cell-regions from each other, the third cell region includes a third element having the first voltage resisting characteristic; and a second plug line supplying a potential of the sub-trunk line to the third element.

In some cases, the semiconductor device may further include, but is not limited to, a fourth cell region closer to the first pad than the second cell region, the second cell region being between the first cell region and the first pad, the fourth cell region including a fourth element having the first voltage resisting characteristic; and a third plug line supplying a potential of the sub-trunk line to the fourth element.

In some cases, the first pad comprises one of a power pad and a ground pad.

Embodiments of the present invention will now be described with reference to the drawings.

First Embodiment

Figure 1:
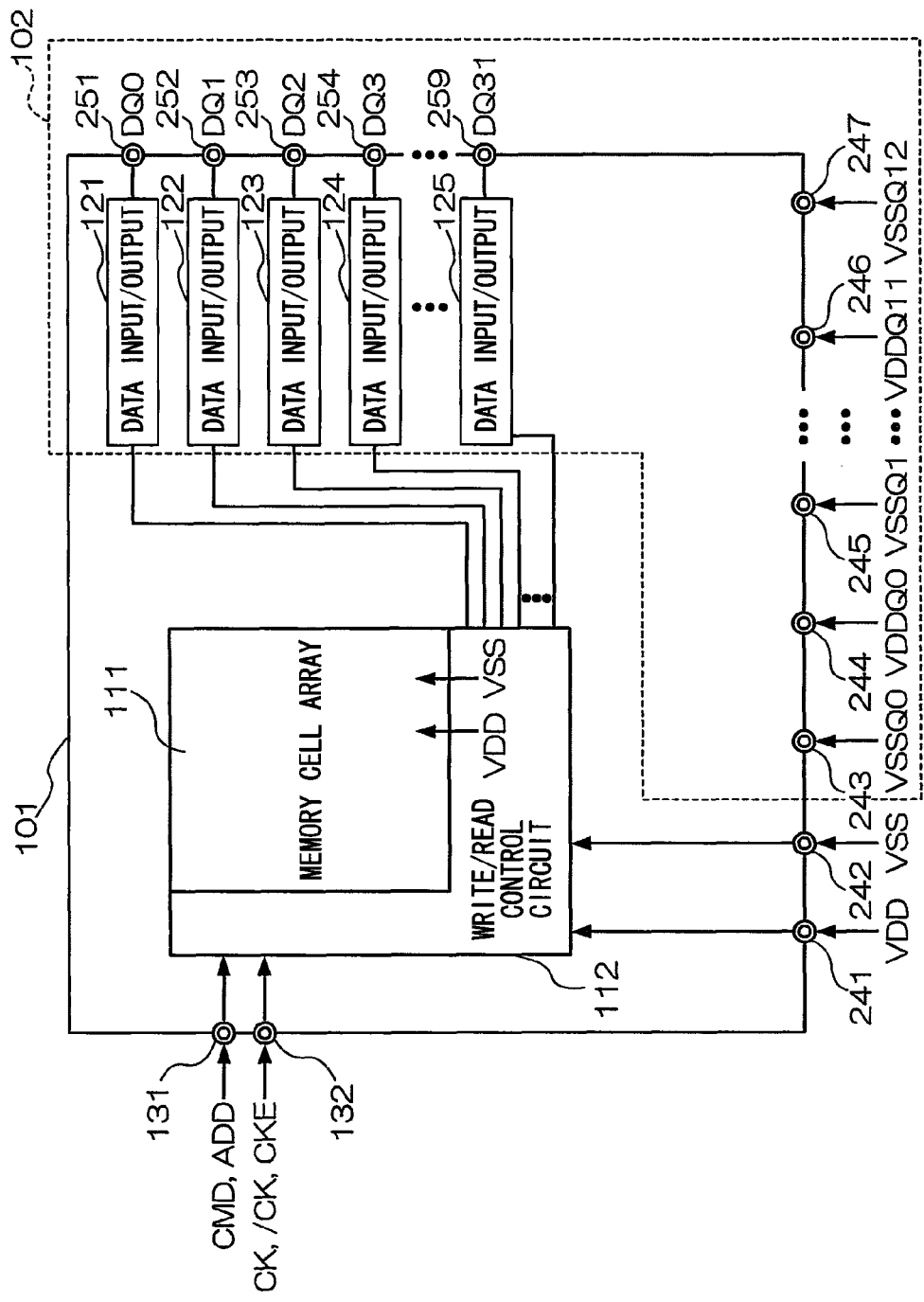
FIG. 1 is a block diagram illustrating a semiconductor memory device in embodiments of the present invention.

FIG. 1 is an entire block diagram showing an example of the entire configuration of a semiconductor device as a semiconductor memory device according to each embodiment of the present invention. A semiconductor memory device 101 includes a memory cell array 111, a write/read control circuit 112, a plurality of data input/output units 121 to 125, a DQ0 terminal 251 to a DQ31 terminal 259, which are input/output terminals each connected to a related one of the plurality of data input/output units 121 to 125, a command (CMD)/address (ADD) terminal group 131, a clock (CK, /CK, CKE) terminal group 132, VDDQ terminals (a VDDQ0 terminal 244 and a VDDQ11 terminal 246), which are power supply terminals of a data system that supply power to the data input/output units 121 to 125 arranged within a block 102 indicated by a dashed line, VSSQ terminals (a VSSQ0 terminal 243, a VSSQ1 terminal 245, and a VSSQ12 terminal 247), a VDD terminal 241 which is a power supply terminal that supplies power to parts other than the data input/output units 121 to 125, and a VSS terminal 242.

The memory cell array 111 includes a plurality of memory cells arranged in a grid shape. On the basis of respective signals input to the CMD/ADD terminal group 131 and the clock terminal group 132, the write/read control unit 112 controls an operation of writing data to the memory cell array 111, an operation of reading data from the memory cell array 111, and the like. Each of the CMD/ADD terminal group 131 and the clock terminal group 132 includes a plurality of terminals.

The input/output terminals, that is, the DQ0 terminal 251, the DQ1 terminal 252, the DQ2 terminal 253, the DQ3 terminal 254, . . . , the DQ31 terminal 259, are connected to the data input/output units 121, 122, 123, 124, . . . , 125, and the respective data input/output units 121 to 125 are connected to the write/read control circuit 112. Read data read by the write/read control circuit 112 from the memory cell array 111 is output from the DQ0 terminal 251 to the DQ31 terminal 259 via the data input/output units 121 to 125. Write data input to the DQ0 terminal 251 to the DQ31 terminal 259 is input to the write/read control circuit 112 via the data input/output units 121 to 125, and is further written to a memory cell of a given address in the memory cell array 111 under control of the write/read control circuit 112. Signal levels of data input/output to/from the DQ0 terminal 251 to the DQ31 terminal 259 are set as potentials applied to the power supply terminals, that is, the VDDQ terminals (the VDDQ0 terminal 244 and the VDDQ11 terminal 246) and the VSSQ terminal (the VSSQ0 terminal 243).

Figure 2:
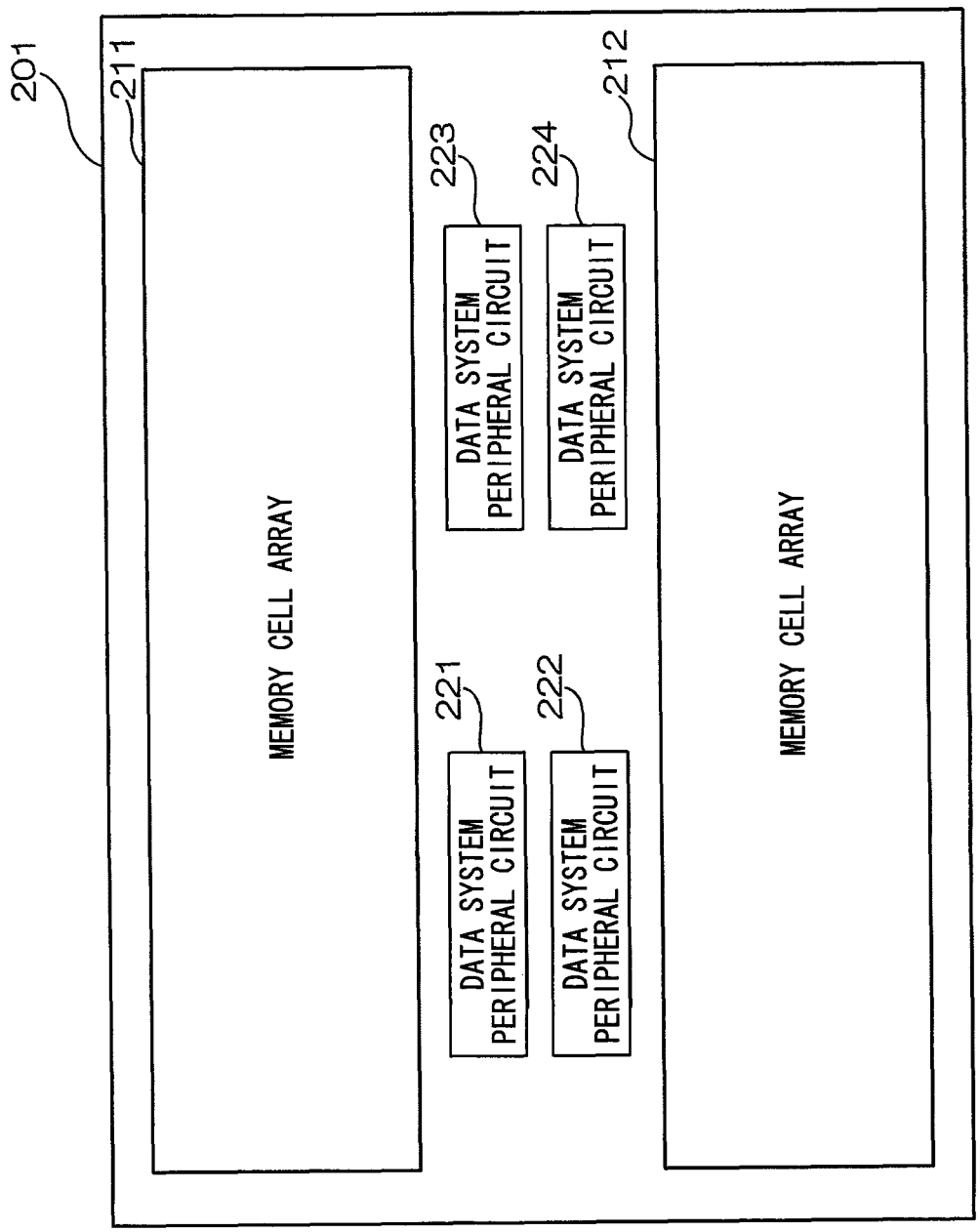
FIG. 2 is a schematic diagram illustrating a chip-layout of the semiconductor memory device of FIG. 1.

FIG. 2 is a schematic diagram of a chip layout of the semiconductor memory device 101 of FIG. 1. Hereinafter, positions of data-system peripheral circuit arrangement regions on a chip to be described below (particularly, in FIGS. 4A, 4B, 5, 8A, 8B, 9, and 10) are shown. The memory cell array 111 of FIG. 1 is divided into two: a memory cell array region 211 and a memory cell array region 212, which are arranged as two stages on a chip 201 corresponding to the semiconductor memory device 101.

Data system peripheral circuit arrangement regions 221 to 224 are arranged in four areas between the memory cell array region 211 and the memory cell array region 212. The data input/output units 121 to 125, DQ pads connected to the DQ0 terminal 251 to the DQ31 terminal 259, which are the input/output terminals, and data system (DQ) power supply pads connected to the VDDQ0 terminal 244, the VDDQ11 terminal 246, the VSSQ0 terminal 243, the VSSQ1 terminal 245, and the VSSQ12 terminal 247, which are the power supply terminals, in FIG. 1, are arranged in the data-system peripheral circuit arrangement regions 221, 222, 223, and 224. The 32 input/output terminals of FIG. 1, i.e., the DQ0 terminal 251 to the DQ31 terminal 259, are divided and arranged by eights in the four data-system peripheral circuit arrangement regions 221, 222, 223, and 224.

Figure 3A:
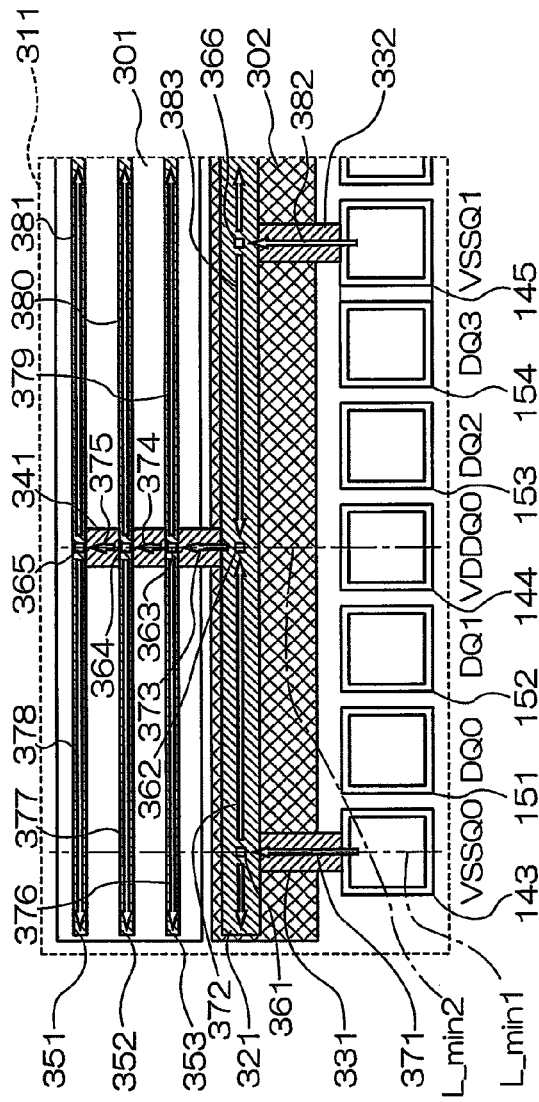
FIG. 3A is a schematic plan view illustrating a configuration of a data-system peripheral circuit region in a first embodiment of the present invention.
Figure 3B:
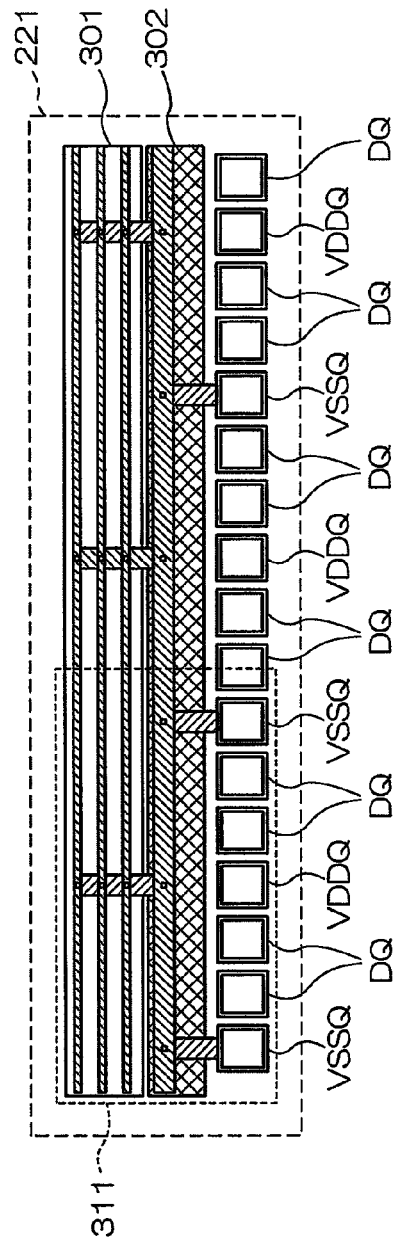
FIG. 3B is a schematic plan view illustrating a configuration of data-system peripheral circuit region in the first embodiment of the present invention.

FIGS. 3A and 3B are schematic plan views showing the configuration of the first embodiment of the present invention, and a schematic plan view of a layout in the data-system peripheral circuit arrangement region 221 of FIG. 2. Here, FIGS. 3A and 3B show a VSSQ wiring portion. A wiring of a VDDQ portion will be described later with reference to FIGS. 4A and 4B. FIG. 3A is an enlarged diagram showing a part 311 within the data-system peripheral circuit arrangement region 221 of FIG. 3B. As shown in FIG. 3B, a plurality of data input/output DQ pads are interposed and arranged between a plurality of DQ power supply pads (VDDQ and VSSQ) in the data-system peripheral circuit arrangement region 221. Here, the plurality of DQ pads shown in FIGS. 3A and 3B include a DQS (data strobe pad) or a DQM (data mask pad) connected to a DQS terminal (data strobe signal terminal) or a DQM terminal (data mask signal terminal) (not shown), or the like as well as a pad connected to any of the input/output terminals, that is, the DQ0 terminal 251 to the DQ31 terminal 259. The VDDQ pad and the VSSQ pad are replaceable along with arrangements of wirings connected thereto.

A cell region 1 (301), which is a first cell region, and a cell region 2 (302), which is a second cell region, are arranged in the data-system peripheral circuit arrangement region 221. A cell group (an output control unit, a level shift unit, an input buffer, compensation capacitance, and the like) using a low voltage element as a first internal element (which may be simply referred to hereinafter as an internal element) is arranged in the cell region 1 (310). Ground potentials from the VSSQ sub-trunk lines 351 to 353 of FIG. 3A are supplied to respective elements arranged in the cell region 1 (301). The cell region 2 (302) is arranged between DQ power supply pads (the VSSQ0 pad 143, the VDDQ0 pad 144, and the VSSQ1 pad 145) and the cell region 1 (301) and extends in an extension direction of the cell region 1 (301). A cell group (a power supply protection element, an input protection element, and an output buffer) using high voltage elements (a protection element and an output buffer) as high voltage elements is arranged in the cell region 2 (302). A ground potential from the VSSQ main trunk line 321 of FIG. 3A is supplied to respective elements arranged in the cell region 2 (302). The configuration of the low voltage element is the same as described with reference to FIG. 13B. A configuration example of the high voltage element having a higher voltage resisting characteristic property than the low voltage element is the same as described with reference to FIG. 13A.

As shown in FIG. 3A, the VSSQ0 pad 143, the DQ0 pad 151, the DQ1 pad 152, the VDDQ0 pad 144, the DQ2 pad 153, the DQ3 pad 154, and the VSSQ1 pad 145 are aligned and arranged in the part 311 in the extension direction of the cell region 1 (301) in this order. Here, the VSSQ0 pad 143 and the VSSQ1 pad 145 are respectively connected to the VSSQ0 terminal 243 and the VSSQ1 terminal 245, which are the power supply terminals for applying the ground potential shown in FIG. 1. The VDDQ0 pad 144 is connected to the VDDQ0 terminal 244, which is the power supply terminal for applying the power supply potential of FIG. 1. The DQ0 pad 151, the DQ1 pad 152, the DQ2 pad 153, and the DQ3 pad 154 are connected to the DQ0 terminal 251, the DQ1 terminal 252, the DQ2 terminal 253, and the DQ3 terminal 254, which are the input/output terminals.

Three VSSQ sub-trunk lines 351, 352, and 353 (having a longitudinal direction) extending in the extension direction of the cell region 1 (301) are arranged in the cell region 1 (301). One VSSQ main trunk line 321 extending in the extension direction of the cell region 1 (301) is arranged in the cell region 2 (302). First VSSQ plug lines 331 and 332 which connect the VSSQ main trunk line 321 to the VSSQ0 pad 143 and the VSSQ1 pad 145 via contact holes 361 and 366 are arranged in the cell region 2 (302). A second VSSQ plug line 341 which connects the three VSSQ sub-trunk lines 351 to 353 to the VSSQ main trunk line 321 via contact holes 362, 363, 364, and 365 is arranged in the cell region 1 (301). The respective wirings are wired by multiple layers, and the VSSQ main trunk line 321 and the VSSQ sub-trunk lines 351, 352, and 353 are formed on a wiring layer different from that of the second VSSQ plug line 341 and the first VSSQ plug lines 331 and 332.

In the example shown in FIGS. 3A and 3B, the VSSQ pads (the VSSQ0 pad 143 and the VSSQ1 pad 145) are connected to the VSSQ main trunk line 321 by the first VSSQ plug lines 331 and 332, and the VSSQ main trunk line 321 is connected to the VSSQ sub-trunk lines 351 to 353 by the second VSSQ plug line 341. The second VSSQ plug line 341 is arranged in a position which is not on straight lines L_min1 connecting the VSSQ pads (the VSSQ0 pad 143 and the VSSQ1 pad 145) to the VSSQ sub-trunk lines 351 to 353 at the shortest distance.

In this embodiment, particularly, the second VSSQ plug line 341 is arranged on a straight line L_min2 connecting the VDDQ pad (VDDQ0 pad 144) to the VSSQ sub-trunk lines 351 to 353 at the shortest distance. In the present embodiment, through such an arrangement, the second VSSQ plug line 341 is arranged at substantially the same distance from the VSSQ0 pad 143 and the VSSQ1 pad 145 and in a position that is not at the shortest distance from each pad.

Thus, in the layout shown in FIGS. 3A and 3B, the VSSQ0 pad 143 (the first pad), and the VSSQ sub-trunk lines 351 to 353 arranged in the cell region 1 for supplying external potentials supplied via the VSSQ0 pad 143 to internal elements in the cell region 1 are not connected at the shortest distance L_min1 between the VSSQ0 pad 143 and the VSSQ sub-trunk lines 351 to 353, and have longer wiring lengths than the shortest distance L_min1. In other words, in the layout shown in FIGS. 3A and 3B, to increase a time until a potential input to the VSSQ0 pad 143 reaches the VSSQ sub-trunk lines 351 to 353, the VSSQ pad and the VSSQ main trunk line 321 and the VSSQ sub-trunk lines 351 to 353 are not connected by a common plug line, but the first VSSQ plug line 331 connecting the VSSQ pad to the VSSQ main trunk line 321 and the second VSSQ plug line 341 connecting (a part of) the VSSQ main trunk line 321 to the VSSQ sub-trunk lines 351 to 353 are provided. That is, the potential input to the VSSQ0 pad 143 is applied to the VSSQ sub-trunk lines 351 to 353 by a wiring portion having a longer wiring length than a straight line connecting between the VSSQ0 pad 143 and the VSSQ sub-trunk lines 351 to 353 at the shortest distance without connecting the VSSQ0 pad 143 to the VSSQ sub-trunk lines 351 to 353 at the shortest distance.

In the layout shown in FIGS. 3A and 3B, the VSSQ0 pad 143 (the first pad) is connected to the contact hole 361 (the first connection point) on the VSSQ main trunk line 321 (the second power supply line) by the first VSSQ plug line 331 (the first plug line), and the VSSQ1 pad 145 (the second pad) is connected to the contact hole 366 (the second connection point) on the VSSQ main trunk line 321 (the second power supply line) by the first VSSQ plug line 332 (the second plug line). The contact hole 362 (the third connection point) on the VSSQ main trunk line 321 located between the contact hole 361 (the first connection point) and the contact hole 366 (the second connection point) and separated from the contact hole 361 (the first connection point) and the contact hole 366 (the second connection point) is connected to the VSSQ sub-trunk lines 351 to 353 by the second VSSQ plug line 341 (the third plug line) without another wiring such as a wiring connecting on the straight line of the shortest distance L_min1.

In the layout shown in FIGS. 3A and 3B, the potential applied to the VSSQ0 pad 143 is propagated along a path indicated by arrows 371, 372, 373, 374 (and 376 and 379), 375 (and 377 and 380), and 378 (and 381), and the like. Also, the potential applied to the VSSQ1 pad 145 is propagated along a path indicated by arrows 382, 383, 373, 374 (and 376 and 379), 375 (and 377 and 380), and 378 (and 381), and the like.

In the case of this layout configuration, the potential input to the VSSQ0 pad 143 is applied to the VSSQ sub-trunk lines 351 to 353 by a wiring portion having a longer wiring length than a straight line connecting between the VSSQ0 pad 143 and the VSSQ sub-trunk lines 351 to 353 at the shortest distance. Accordingly, when an abnormal potential is applied to the VSSQ pad 143, it is possible to reduce a risk of the overvoltage being applied to the low voltage element (the internal element) arranged in the cell region 1 (301) before a protection element (an high voltage element) (not shown) in the cell region 2 (302) is in the conductive state to discharge the abnormal potential from another VSSQ pad via the common discharge line 501. That is, since the first VSSQ plug lines 331 and 332 connecting the VSSQ pads to the VSSQ main trunk line 321 are not directly connected to the VSSQ sub-trunk lines 351 to 353, it is possible to increase a time until the overvoltage applied to the VSSQ pad 143 is propagated to the low voltage element (the internal element) arranged in the cell region 1 (301) to which ground potentials from the VSSQ sub-trunk lines 351 to 353 are supplied, in comparison with the case where the first VSSQ plug lines 331 and 332 are directly connected to the VSSQ sub-trunk lines 351 to 353, and it is possible to reduce a risk of the overvoltage being applied to the internal element and the internal element being subjected to electrostatic breakdown.

Figure 4A:
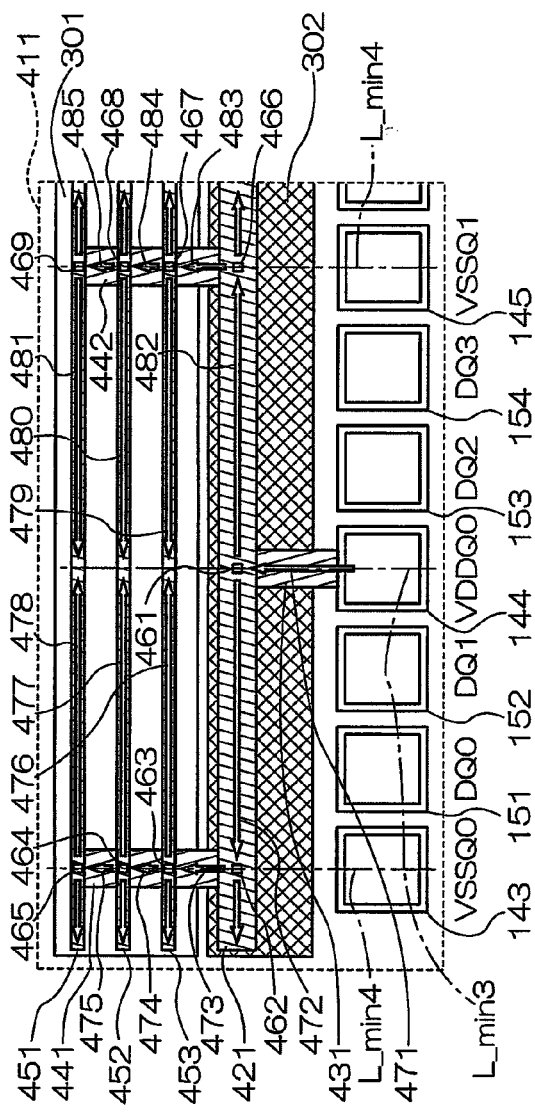
FIG. 4A is a schematic plan view illustrating a configuration of a data-system peripheral circuit region in the first embodiment of the present invention.
Figure 4B:
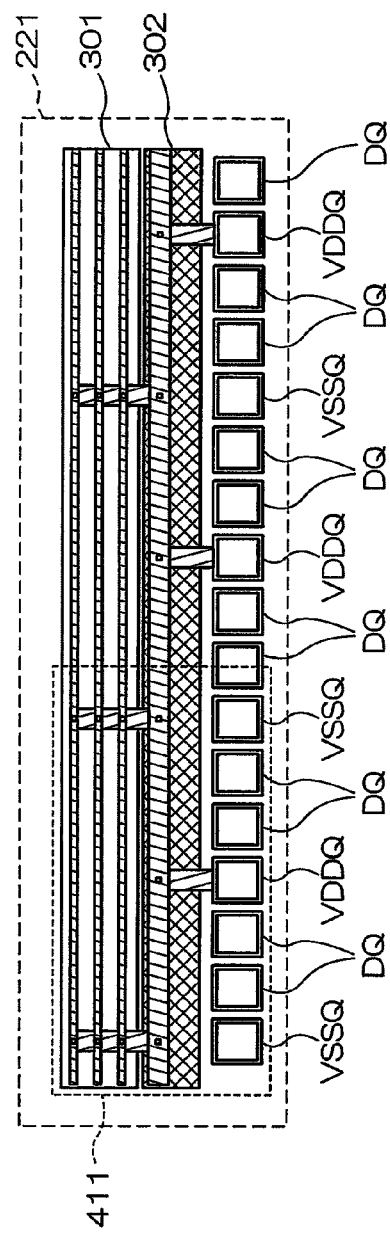
FIG. 4B is a schematic plan view illustrating a configuration of data-system peripheral circuit region in the first embodiment of the present invention.

FIGS. 4A and 4B are schematic plan views showing the configuration (VDDQ wiring) of the data-system peripheral circuit arrangement region of the first embodiment, and are schematic plan views of a layout in the data-system peripheral circuit arrangement region 221 of FIG. 2. In FIGS. 4A and 4B, the same elements as shown in FIGS. 3A and 3B are denoted by the same reference numerals. FIG. 4A is an enlarged view of a part 411 (a region corresponding to the part 311 of FIGS. 3A and 3B) in the data-system peripheral circuit arrangement region 221 of FIG. 4B.

Power supply potentials are supplied from VDDQ sub-trunk lines 451 to 453 of FIG. 4A to respective elements (respective internal elements) arranged in the cell region 1 (301). Also, a power supply potential from a VDDQ main trunk line 421 of FIG. 4A is supplied to respective elements (a protection element and an output buffer) arranged in the cell region 2 (302).

Three VDDQ sub-trunk lines 451, 452, and 453 (having a longitudinal direction) extending in the extension direction of the cell region 1 (301) are arranged in the cell region 1 (301). One VDDQ main trunk line 421 extending in the extension direction of the cell region 1 (301) is arranged in the cell region 2 (302). A first VDDQ plug line 431 which connects the VDDQ main trunk line 421 to the VDDQ0 pad 144 via a contact hole 461 is arranged in the cell region 2 (302). Second VDDQ plug lines 441 and 442 which connect the three VSSQ sub-trunk lines 451 to 453 to the VSSQ main trunk line 421 via contact holes 462, 463, 464, 465, 466, 467, 468, and 469 are arranged in the cell region 1 (301). The respective wirings are wired by multiple layers, and the VDDQ main trunk line 421 and the VDDQ sub-trunk lines 451, 452, and 453 are formed on a wiring layer different from that of the second VDDQ plug lines 441 and 442 and the first VDDQ plug line 431.

In the example shown in FIGS. 4A and 4B, the VDDQ pad (the VDDQ0 pad 144) is connected to the VDDQ main trunk line 421 by the first VDDQ plug line 431, and the VDDQ main trunk line 421 is connected to the VDDQ sub-trunk lines 451 to 453 by the second VDDQ plug lines 441 and 442. The second VDDQ plug lines 441 and 442 are arranged in positions which are not on straight lines L_min3 connecting the VDDQ pad (VDDQ0 pad 144) to the VDDQ sub-trunk lines 451 to 453 at the shortest distance.

In this embodiment, particularly, the second VDDQ plug lines 441 and 442 are arranged on straight lines L_min4 connecting the VSSQ pads (the VSSQ0 pad 143 and the VSSQ1 pad 145) to the VDDQ sub-trunk lines 451 to 453 at the shortest distance. In this embodiment, through such an arrangement, the second VDDQ plug lines 441 and 442 are arranged at substantially the same distance from the VDDQ0 pad 144 and in positions that are not at the shortest distance from each pad.

In the layout shown in FIGS. 4A and 4B, the potential applied to the VDDQ0 pad 144 is propagated along a path indicated by arrows 471, 472, 473, 474 (and 476), 475 (and 477), and 478, and the like, and is also propagated along a path indicated by arrows 471, 482, 483, 484 (and 479), 485 (and 480), and 481, and the like.

In the case of this layout configuration, the potential input to the VDDQ0 pad 144 is applied to the VDDQ sub-trunk lines 451 to 453 by a wiring portion having a longer wiring length than a straight line connecting between the VDDQ0 pad 144 and the VDDQ sub-trunk lines 451 to 453 at the shortest distance. Accordingly, when an abnormal potential is applied to the VDDQ pad 144, it is possible to reduce a risk of the overvoltage being applied to the low voltage element (the internal element) arranged in the cell region 1 (301) before a protection element (an high voltage element) (not shown) in the cell region 2 (302) is in the conductive state to discharge the abnormal potential from another VSSQ pad via the common discharge line 501. That is, since the first VDDQ plug line 431 connecting the VDDQ pad to the VDDQ main trunk line 421 is not directly connected to the VDDQ sub-trunk lines 451 to 453, it is possible to increase a time until the overvoltage applied to the VDDQ0 pad 144 is propagated to the low voltage element (the internal element) arranged in the cell region 1 (301) to which power supply potentials from the VDDQ sub-trunk lines 451 to 453 are supplied, in comparison with the case where the first VDDQ plug line 431 is directly connected to the VDDQ sub-trunk lines 451 to 453, and it is possible to reduce a risk of the overvoltage being applied to the internal element and the internal element being subjected to electrostatic breakdown.

In addition, in FIGS. 3A, 3B, 4A, and 4B, the VSSQ wiring and the VDDQ wiring are shown in the separate drawings, but both the VSSQ wiring and the VDDQ wiring are actually formed in the data-system peripheral circuit arrangement region. Preferably, the VSSQ main trunk line 321, the VDDQ main trunk line 421, the VSSQ sub-trunk lines 351, 352, and 353, and VDDQ sub-trunk lines 451, 452, and 453 are formed on the same wiring layer, and the second VSSQ plug line 341, the first VSSQ plug lines 331 and 332, the second VDDQ plug lines 441 and 442, and the first VDDQ plug line 431 are formed on the same wiring layer. The VSSQ main trunk line 321 is insulated from the VDDQ main trunk line 421 and formed to extend along the VDDQ main trunk line 421. Likewise, the VSSQ sub-trunk lines 351, 352, and 353 are insulated from the VDDQ sub-trunk lines 451, 452, and 453 and formed to extend along the VDDQ sub-trunk lines 451, 452, and 453.

Figure 5:
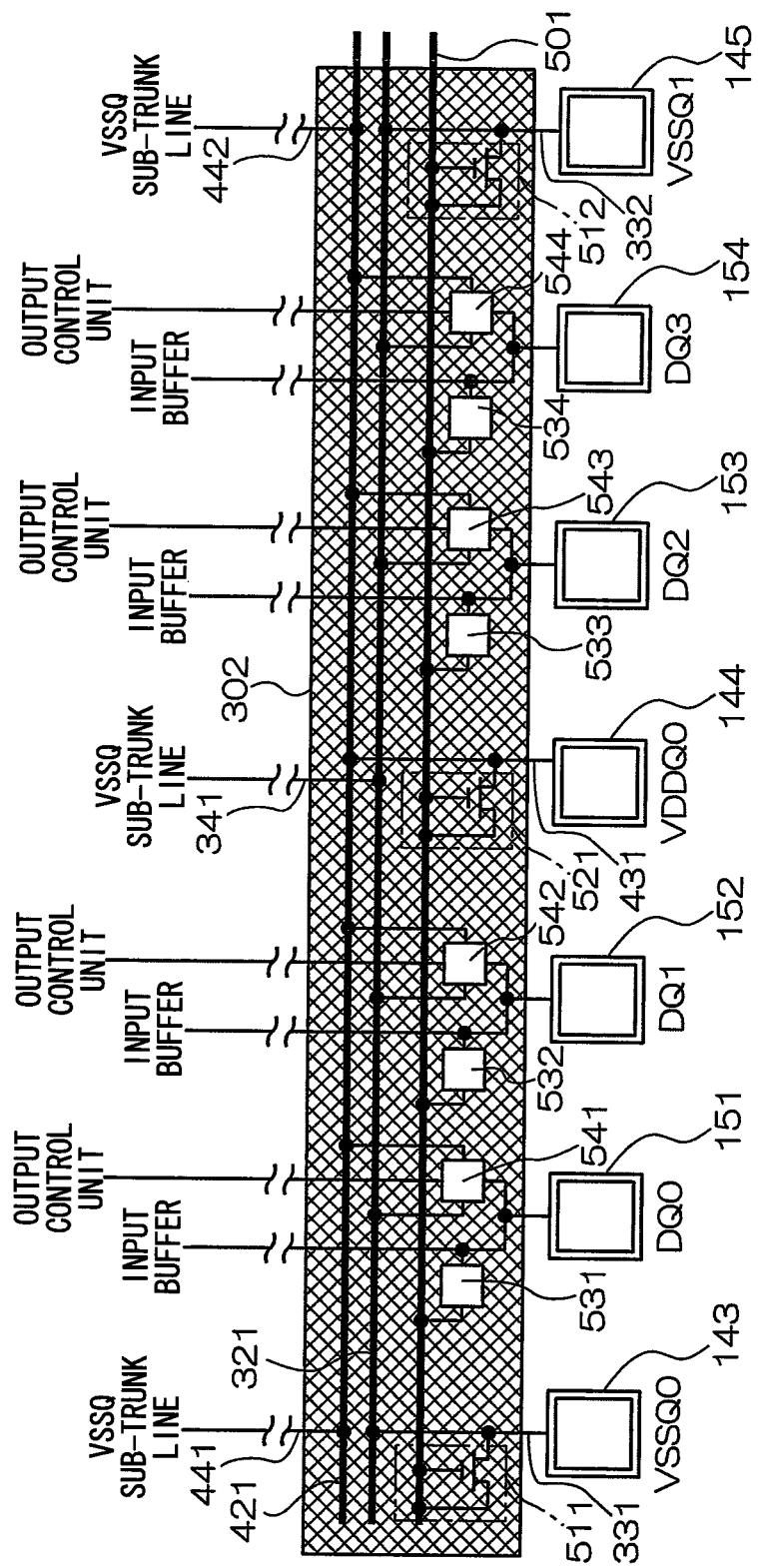
FIG. 5 is a diagram illustrating a circuit layout near a cell region in FIGS. 3A, 3B, 4A and 4B.

FIG. 5 is a schematic diagram showing a circuit arrangement around the cell region 2 (302) of FIGS. 3A, 3B, 4A, and 4B. The same elements as shown in FIGS. 3A, 3B, 4A, 4B, and 14 are denoted by the same reference numerals. In FIG. 5, the VSSQ main trunk line 321, the VDDQ main trunk line 421, the common discharge line 501, the second VSSQ plug line 341, the second VDDQ plug lines 441 and 442, the first VSSQ plug lines 331 and 332, the first VDDQ plug line 431, power supply protection elements 511, 512, and 521, input protection elements 531, 532, 533, and 534, and output buffers 541, 542, 543, and 544 are arranged in the cell region 2 (302).

The common discharge line 501 is connected to the VSSQ0 pad 143 via the power supply protection element 511, to the VSSQ1 145 via the power supply protection element 512, to the VDDQ0 pad 144 via the power supply protection element 521, and to the DQ0 pad 151, the DQ1 pad 152, the DQ2 pad 153, and the DQ3 pad 154 via the input protection elements 531, 532, 533, and 544. The common discharge line 501 is a trunk line used to discharge an overvoltage such as static electricity from the VSSQ0 pad 143 or the VSSQ1 pad 145 when the overvoltage is applied to each pad. A ground potential from a power supply pad (not shown) is supplied to the common discharge line 501.

When an overvoltage such as static electricity is applied to any one of the VSSQ0 pad 143, the VSSQ1 pad 145, the VDDQ0 pad 144, and the DQ pad, the power supply protection elements 511 and 512 are operated (in the conductive state), and discharge the overvoltage applied to the VSSQ0 pad 143 or the VSSQ1 pad 145 from another VSSQ pad via the common discharge line 501. Specifically, for example, when the overvoltage is applied to the VSSQ0 pad 143, the power supply protection element discharges the overvoltage from the VDDQ0 pad 144, and when the overvoltage is applied to the VDDQ0 pad 144, the power supply protection element discharges the overvoltage from the VSSQ pad 143. When an overvoltage such as static electricity is applied to the VDDQ0 pad 144, the power supply protection element 521 discharges the overvoltage from the VSSQ0 pad 143 or the VSSQ1 pad 145 via the common discharge line 501.

The input protection elements 531, 532, 533, and 534 are connected between the DQ0 pad 151, the DQ1 pad 152, the DQ2 pad 153, and the DQ3 pad 154 and input buffers (not shown) in the cell region 1 (301), and discharge an overvoltage such as static electricity from the VSSQ0 pad 143 or the VSSQ1 pad 145 via the common discharge line 501 and the power supply protection element 511 or 512 when the overvoltage is applied to the respective DQ pads 151 to 154.

The output buffers 541, 542, 543, and 544 are connected between the DQ0 pad 151, the DQ1 pad 152, the DQ2 pad 153, and DQ3 pad 154 and an output control unit (not shown) in the cell region 1 (301), and are operated using a voltage between the VSSQ main trunk line 1521 and the VDDQ main trunk line 421 as a power supply voltage.

Figure 6:
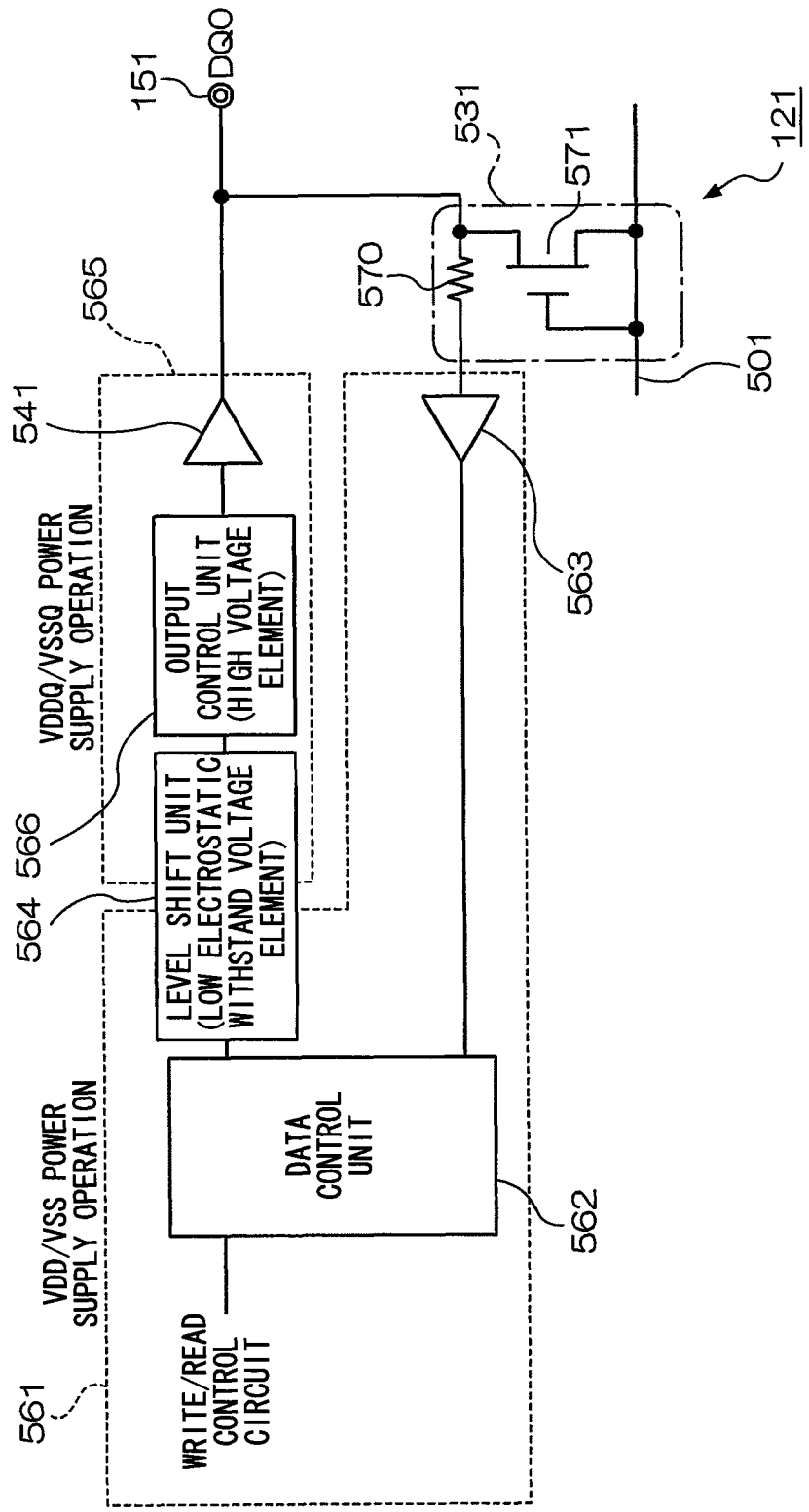
FIG. 6 is a diagram illustrating a configuration of a data input/output unit in the semiconductor device of FIG. 1.

FIG. 6 is a block diagram showing a configuration example of the data input/output units 121 to 125 of FIG. 1 (here, the data input/output unit 121 is shown as a representative). In FIG. 6, the same elements as shown in FIG. 5 are denoted by the same reference numerals. In the configuration example shown in FIG. 6, a data control unit 562 connected to the write/read control circuit 112 of FIG. 1 and an input buffer 563 having an output connected to the data control unit 562 are provided in a circuit block 561 operating by the VDD or VSS power. An output control unit 566 and an output buffer 541 having an input connected to the output control unit 566 are provided in the circuit block 565 operating by the VDDQ or VSSQ power. A level shift unit 564 is provided between the data control unit 562 and the output control unit 566. The DQ0 pad 151 is connected to an output of the output buffer 541, the input protection element 531, and a resistor 570. The input protection element 531 includes an NMOS transistor 571, which has one terminal connected to a wiring which connects the resistor 570 to the DQ0 pad, and another terminal and a control terminal all connected to the common discharge line 501.

A circuit of at least the last stage in the level shift unit 564, the output control unit 566, and the output buffer 541 are operated by power supplied from the VDDQ/VSSQ terminal. The remaining part is operated by power supplied from the VDD/VSS terminal A peripheral potential VPERI is internally generated on the basis of VDD. Here, VSS and VSSQ, and VDD and VSSQ are not connected to each other.

The output buffer 541 and the input protection element 531 directly connected to the DQ0 pad 151 are formed by high voltage elements, and are arranged in the cell region 2 (302). The level shift unit 564, the output control unit 566, the input buffer 563, and the data control unit 562 are formed by low voltage elements, and are arranged in the cell region 1 (301).

Figure 7:
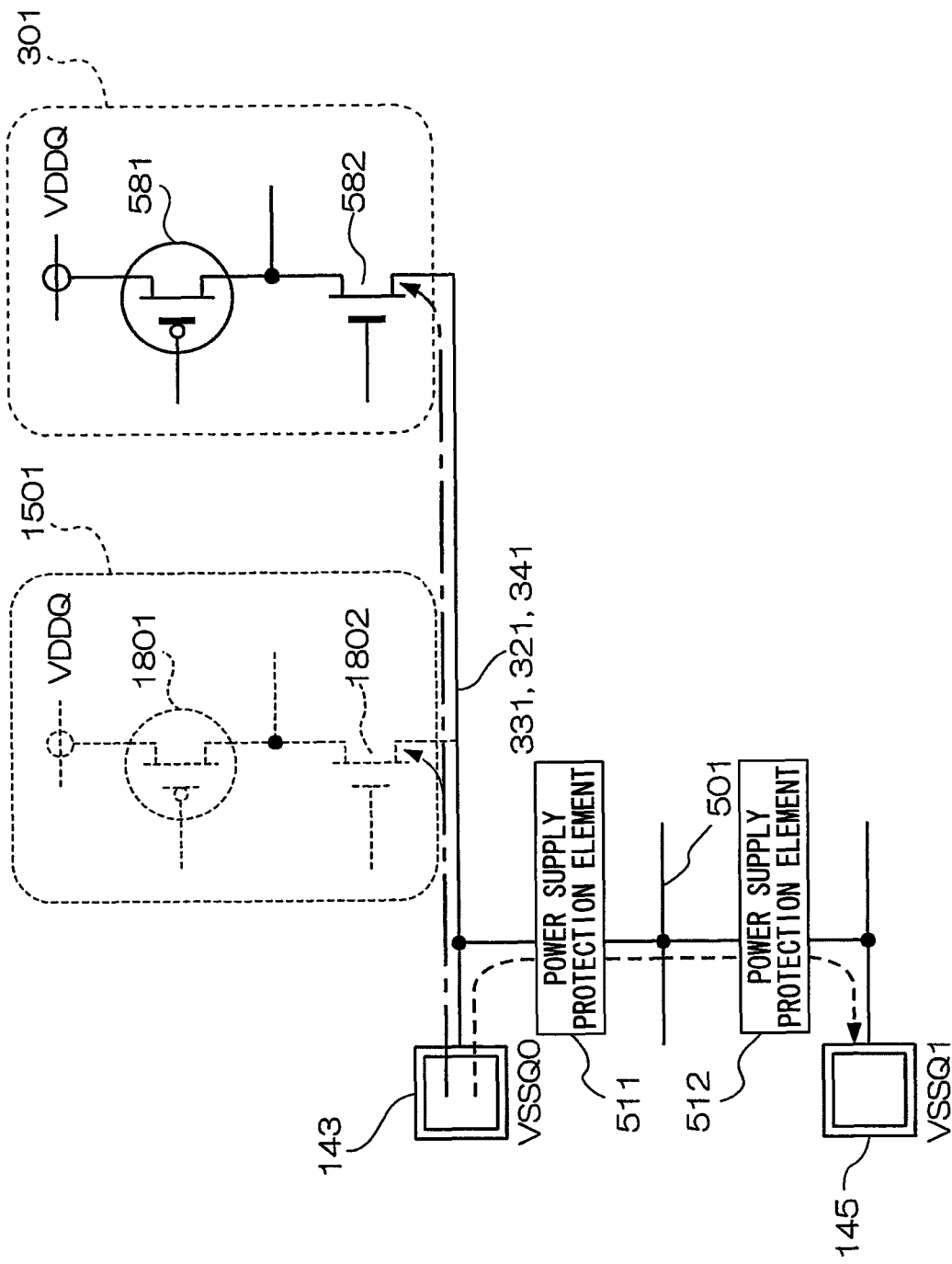
FIG. 7 is a circuit diagram illustrating operations of the semiconductor device of FIG. 1 when an overvoltage is applied.

FIG. 7 is a conceptual diagram illustrating an operation when an overvoltage is applied to the VSSQ0 pad 143 shown in FIG. 5. When the power supply protection elements 511 and 512 function normally, that is, in the conductive state, the abnormal potential applied to the VSSQ0 pad 143 is discharged to the VSSQ1 pad 145, which is another VSSQ pad, along a path indicated by a dashed arrow via the power supply protection element 511, the common discharge line 501, and the power supply protection element 512.

Thus, when the power supply protection elements 511 and 512 function normally, that is, in the conductive state, the overvoltage is not applied to an internal element (low voltage element) 1802 in the cell region 1 (1501) and the internal element (low voltage element) 1802 is not subjected to electrostatic breakdown.

In the configuration of this embodiment, the VSSQ0 pad 143 and the VSSQ sub-trunk lines 351 to 353 are connected by the wiring portion having a longer wiring length than a straight line connecting between the VSSQ0 143 and the VSSQ sub-trunk lines 351 to 353 at the shortest distance, instead of being connected at the shortest distance as shown in FIGS. 3A and 3B, so that a wiring length from the VSSQ pad 143 to the internal element 581 in the cell region 1 (301) is longer in comparison with the internal element 1801 in the cell region 1 (1501) shown in FIG. 15. More specifically, in the present embodiment, a total time constant of the first VSSQ plug line 331, the VSSQ main trunk line 321, and the second VSSQ plug line 341 shown in FIG. 5 is longer than a time until the power supply protection element 511 is in the conductive state when an overvoltage is applied to the VSSQ0 pad 143 shown in FIG. 5.

Accordingly, in the layout configuration of this embodiment, when the overvoltage is applied to the VSSQ0 pad 143 shown in FIG. 5, the overvoltage is not applied to the low voltage element (an internal element) arranged in the cell region 1 (301) before the power supply protection elements 511 and 512 are in the conductive state.

Figure 11A:
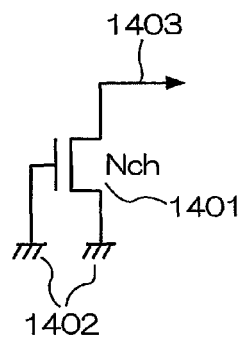
FIG. 11A is a circuit diagram illustrating an equivalent circuit of an element placed in cell regions in the semiconductor device of FIG. 1.
Figure 11B:
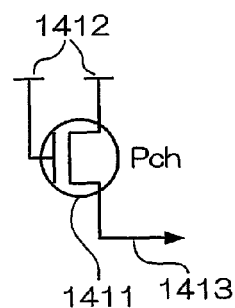
FIG. 11B is a circuit diagram illustrating another equivalent circuit of an element placed in cell regions in the semiconductor device of FIG. 1.
Figure 11C:
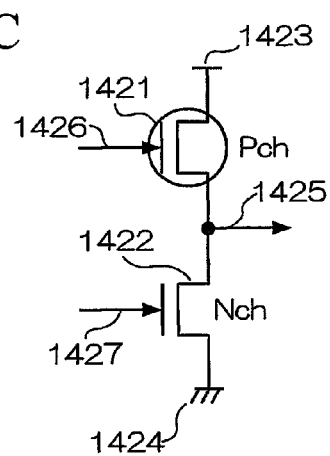
FIG. 11C is a circuit diagram illustrating still another equivalent circuit of an element placed in cell regions in the semiconductor device of FIG. 1.
Figure 11D:
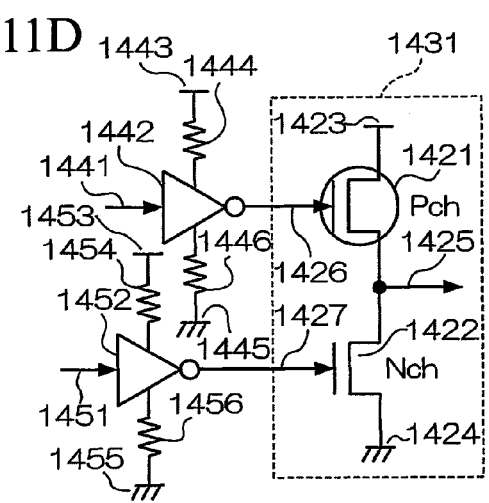
FIG. 11D is a circuit diagram illustrating still another equivalent circuit of an element placed in cell regions in the semiconductor device of FIG. 1.

Here, equivalent circuits of respective elements arranged in the cell region 2 (302) shown in FIGS. 3A to 7 will be described with reference to FIGS. 11A to 11D. FIG. 11A shows an example of the input protection element or the power supply protection element (hereinafter, described as an ESD protection element in the description of FIGS. 11A to 11D). FIG. 11B shows another example of the ESD protection element. FIG. 11C shows an example of output circuit elements. FIG. 11D shows an example of the output circuit elements of FIG. 11C and circuit elements in a previous stage.

The ESD protection element of FIG. 11A includes an N channel transistor (metal oxide semiconductor (MOS) transistor) 1401 having a control electrode (gate) and one electrode (source or drain) connected to a ground potential 1402 as the common discharge line 501 shown in FIG. 5, and another electrode (drain or source) connected to a wiring 1403 to be protected. The ESD protection element of FIG. 11B includes a P channel transistor 1411 having a control terminal (gate) and one electrode (source or drain) connected to a power supply potential 1412, and another electrode (drain or source) connected to a wiring 1413 to be protected. Here, if the ESD protection element shown in FIG. 11B is used as a power supply protection element, a common discharge line to which a power supply potential is supplied from a power supply pad (not shown) is used as the power supply potential 1412, instead of the common discharge line 501 shown in FIG. 5. The output circuit elements of FIG. 11C include a P channel transistor 1421 and an N channel transistor 1422 having gates respectively connected to complementary signal lines 1426 and 1427. In this case, a source of the P channel transistor 1421 is connected to the power supply potential 1423, and a drain thereof is connected to an output signal line 1425. A source of the N channel transistor 1422 is connected to a ground potential 1424, and a drain thereof is connected to the output signal line 1425.

The circuit of FIG. 11D includes the output circuit 1431 of FIG. 11C, an inverter 1442 having an output connected to a signal line 1426, and an inverter 1452 having an output connected to a signal line 1427. The inverter 1442 is connected to a power supply potential 1443 via a resistor 1444 and a ground potential 1445 via a resistor 1446. The inverter 1452 is connected to a power supply potential 1453 via a resistor 1454 and a ground potential 1455 via a resistor 1456. Inputs of the inverters 1442 and 1452 are connected to complementary signal lines 1441 and 1451.

Second Embodiment

Figure 8A:
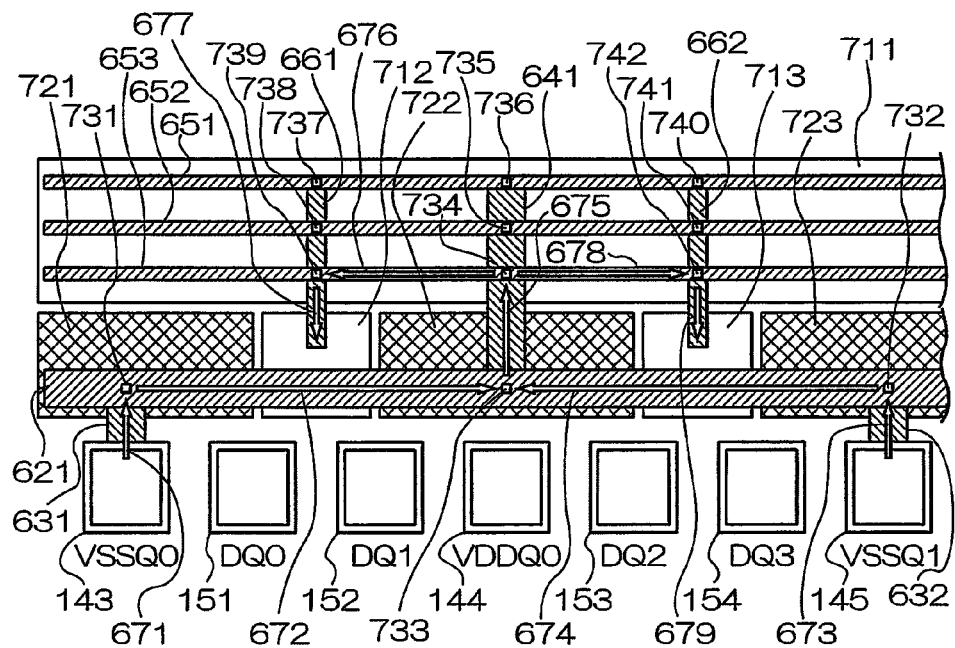
FIG. 8A is a schematic plan view illustrating a configuration of a data-system peripheral circuit region in a second embodiment of the present invention.
Figure 8B:
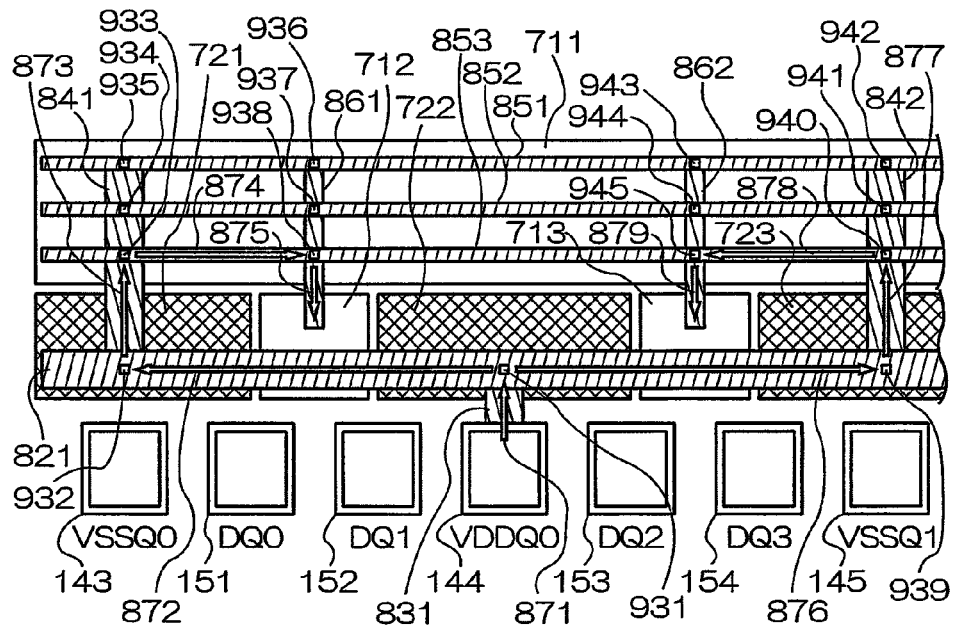
FIG. 8B is a schematic plan view illustrating a configuration of data-system peripheral circuit region in the second embodiment of the present invention.

A second embodiment of the present invention will be described with reference to FIGS. 8A and 8B. FIGS. 8A and 8B are schematic plan views showing the configuration of the second embodiment of the present invention, and are schematic plan views of the layout within the data-system peripheral circuit arrangement region 221 of FIG. 2. FIG. 8A shows a VSSQ wiring portion. FIG. 8B shows a VDDQ wiring portion.

FIG. 8A is a schematic plan view of a layout of a part in the data-system peripheral circuit arrangement region 221 corresponding to a partial region 311 of FIGS. 3A and 3B. In this case, in the region shown in FIG. 8A, the cell region 2 corresponding to the cell region 2 (302) of FIGS. 3A and 3B is divided into a plurality of cell regions 2 (721), (722), and (723) as first and second portions, and the respective pads 143, 151, 152, 144, . . . are arranged to be distributed in an aligned direction. The cell region 1 includes a cell region 1a (711) as a first cell region corresponding to the cell region 1 (301) of FIGS. 3A and 3B, a cell region 1b (712) as a third cell region arranged between the cell regions 2 (721) and (722) that are newly added region, and a cell region 1b (713) as the third cell region arranged between the cell regions 2 (722) and (723).

A cell group (an output control unit, a level shift unit, an input buffer, compensation capacitance, and the like) using an low voltage element (internal element) (first or second internal element) is arranged in the cell regions 1a (711), 1b (712), and 1b (713). Ground potentials from the VSSQ sub-trunk lines 651 to 653 or the third VSSQ plug line 661 or 662 are supplied to respective elements arranged in the cell regions 1a (711), 1b (712), and 1b (713). The cell regions 2 (721), (722), and (723) are arranged between DQ power supply pads (the VSSQ0 pad 143, the VDDQ0 pad 144, and the VSSQ1 pad 145) and the cell region 1a (711) and extend in an extension direction of the cell region 1a (711). A cell group (a power supply protection element, an input protection element, and an output buffer) using high voltage elements (a protection element and an output buffer) is arranged in the cell regions 2 (721), (722), and (723). A ground potential from the VSSQ main trunk line 621 is supplied to respective elements arranged in the cell regions 2 (721), (722), and (723). The configuration of the low voltage element is the same as described with reference to FIG. 13B. A configuration example of the high voltage element having a higher voltage resisting characteristic property than the low voltage element is the same as described with reference to FIG. 13A.

In the region shown in FIG. 8A, the VSSQ0 pad 143, the DQ0 pad 151, the DQ1 pad 152, the VDDQ0 pad 144, the DQ2 pad 153, the DQ3 pad 154, and the VSSQ1 pad 145 are aligned and arranged in the extension direction of the cell region 1a (711) in this order. Here, the VSSQ0 pad 143 and the VSSQ1 pad 145 are respectively connected to the VSSQ0 terminal 243 and the VSSQ1 terminal 245, which are the power supply terminals for applying the ground potential of FIG. 1. The VDDQ0 pad 144 is connected to the VDDQ0 terminal 244, which is the power supply terminal for applying the power supply potential of FIG. 1. The DQ0 pad 151, the DQ1 pad 152, the DQ2 pad 153, and the DQ3 pad 154 are connected to the DQ0 terminal 251, the DQ1 terminal 252, the DQ2 terminal 253, and the DQ3 terminal 254, which are the input/output terminals.

Three VSSQ sub-trunk lines 651, 652, and 653 (having a longitudinal direction) extending in the extension direction of the cell region 1a (711) are arranged in the cell region 1a (711). One VSSQ main trunk line 621 extending in the extension direction of the cell region 1a (711) is arranged in the cell regions 2 (721), (722), and (723). First VSSQ plug lines 631 and 632 which connect the VSSQ main trunk line 621 to the VSSQ0 pad 143 and the VSSQ1 pad 145 via contact holes 731 and 732 are arranged in the cell regions 2 (721), (722), and (723). A second VSSQ plug line 641 which connects the three VSSQ sub-trunk lines 651 to 653 to the VSSQ main trunk line 621 via contact holes 733, 734, 735, and 736 is arranged in the cell region 1a (711). Respective internal elements in the cell regions 1b (712) and (713) are respectively connected to the VSSQ sub-trunk lines 651, 652, and 653 via the third VSSQ plug line 661 or 662. The third VSSQ plug lines 661 and 662 are respectively connected to the VSSQ sub-trunk lines 651, 652, and 653 via contact holes 737 to 742.

The respective wirings are wired by multiple layers, and the VSSQ main trunk line 621 and the VSSQ sub-trunk lines 651, 652, and 653 are formed on a wiring layer different from that of the second VSSQ plug line 641, the first VSSQ plug lines 631 and 632 and the third VSSQ plug lines 661 and 662.

In the layout shown in FIG. 8A, the potential applied to the VSSQ0 pad 143 is propagated along a path indicated by arrows 671, 672, 675, 676, and 677 (and 678 and 679), and the like. Also, the potential applied to the VSSQ1 pad 145 is propagated along a path indicated by arrows 673, 674, 675, 676, and 677 (and 678 and 679), and the like.

In case of this layout configuration, the potential input to the VSSQ0 pad 143 is applied to the VSSQ sub-trunk lines 651 to 653 by a wiring portion having a longer wiring length than a straight line connecting between the VSSQ0 pad 143 and the VSSQ sub-trunk lines 651 to 653 at the shortest distance, as in the first embodiment. Accordingly, when an abnormal potential is applied to the VSSQ pad 143, it is possible to reduce a risk of the overvoltage being applied to low voltage elements (internal elements) arranged in the cell region 1a (711) and the cell regions 1b (712) and (713) before protection elements (not shown) (high voltage elements) within the cell regions 2 (721), (722), and (723) are in the conductive state to discharge the abnormal potential from another VSSQ pad via the common discharge line 501. That is, since the first VSSQ plug lines 631 and 632 connecting the VSSQ pads to the VSSQ main trunk line 621 are not directly connected to the VSSQ sub-trunk lines 651 to 653, it is possible to increase a time until the overvoltage applied to the VSSQ pad 143 is propagated to low voltage elements (internal elements) arranged in the cell region 1a (711) and the cell regions 1b (712) and (713) to which ground potentials from the VSSQ sub-trunk lines 651 to 653 are supplied, in comparison with the case where the first VSSQ plug lines 631 and 632 are directly connected to the VSSQ sub-trunk lines 651 to 653, and it is possible to reduce a risk of the overvoltage being applied to the internal element and the internal element being subjected to electrostatic breakdown.

The configuration of the second embodiment shown in FIG. 8A differs from that of the first embodiment shown in FIGS. 3A and 3B. The cell regions 1b (712) and (713) are arranged between the cell regions 2 (721), (722), and (723). Third plug lines (third VSSQ plug lines 661 and 662) are newly provided. Power is supplied to the cell regions 1b (712) and (713) via the pads (VSSQ0 pad 143 and VSSQ1 pad 145), the first plug lines (first VSSQ plug lines 631 and 632), the main trunk line (VSSQ main trunk line 621), the second plug line (second VSSQ plug line 641), the sub-trunk lines (VSSQ sub-trunk lines 651, 652, and 653), the third plug lines (third VSSQ plug lines 661 and 662).

The main power supply trunk line (VSSQ main trunk line 621) is arranged on the cell regions 1b (712) and (713), but power is not directly supplied from the main power supply trunk line (VSSQ main trunk line 621) to the cell regions 1b (712) and (713). That is, a contact hole which connects the cell regions 1b (712) and (713) to the main power supply trunk line (VSSQ main trunk line 621) is not arranged.

According to the configuration shown in FIG. 8A, it is possible to arrange an internal element as an low voltage element around a pad and reduce a chip size.

FIG. 8B is a schematic plan view of a layout of a part in the data-system peripheral circuit arrangement region 221 corresponding to a partial region of FIG. 8A, particularly, a VDDQ wiring. In FIG. 8B, the same elements as shown in FIG. 8A are denoted by the same reference numerals.

In FIG. 8B, power supply potentials are supplied from the VDDQ sub-trunk lines 851 to 853 and the third VDDQ plug lines 861 and 862 to respective elements arranged in the cell regions 1a (711), 1b (712), and 1b (713). Also, a power supply potential from a VDDQ main trunk line 821 is supplied to respective elements arranged in the cell regions 2 (721), (722), and (723).

Three VDDQ sub-trunk lines 851, 852, and 853 (having a longitudinal direction) extending in the extension direction of the cell region 1a (711) are arranged in the cell region 1a (711). One VDDQ main trunk line 821 extending in the extension direction of the cell region 1a (711) is arranged in the cell regions 2 (721), (722), and (723). A first VDDQ plug line 831 which connects the VDDQ main trunk line 821 to the VDDQ0 pad 144 via a contact hole 931 is arranged in the cell regions 2 (721), (722), and (723). A second VDDQ plug line 841 which connects the three VDDQ sub-trunk lines 851 to 853 to the VDDQ main trunk line 821 via contact holes 932, 933, 934, and 935, and a second VDDQ plug line 842 which connects the three VDDQ sub-trunk lines 851 to 853 to the VDDQ main trunk line 821 via contact holes 939, 940, 941, and 942 are arranged in the cell region 1a (711). Respective internal elements in the cell regions 1b (712) and (713) are respectively connected to the VDDQ sub-trunk lines 851, 852, and 853 via the third VDDQ plug line 861 and 862. The third VDDQ plug lines 861 and 862 are respectively connected to the VSSQ sub-trunk lines 851, 852, and 853 via contact holes 936 to 938 and 943 to 945.

The respective wirings are wired by multiple layers, and the VDDQ main trunk line 821 and the VDDQ sub-trunk lines 851, 852, and 853 are formed on a wiring layer different from that of the second VDDQ plug lines 841 and 842, the first VDDQ plug line 831, and the third VDDQ plug lines 861 and 862.

In the layout shown in FIG. 8B, the potential applied to the VDDQ0 pad 144 is propagated along a path indicated by arrows 871, 872, 873, 874, and 875, and the like, and is also propagated along a path indicated by arrows 871, 876, 877, 878, and 879, and the like.

In this layout configuration, the potential input to the VDDQ0 pad 144 is applied to the VDDQ sub-trunk lines 851 to 853 by a wiring portion having a longer wiring length than a straight line connecting between the VDDQ0 pad 144 and the VDDQ sub-trunk lines 851 to 853 at the shortest distance, as in the first embodiment. Accordingly, when an abnormal potential is applied to the VDDQ pad 144, it is possible to reduce a risk of the overvoltage being applied to low voltage elements (internal elements) arranged in the cell region 1a (711) and the cell regions 1b (712) and (713) before protection elements (not shown) (high voltage elements) within the cell regions 2 (721), (722), and (723) are in the conductive state to discharge the abnormal potential from the VSSQ pad via the common discharge line 501. That is, since the first VDDQ plug line 431 which connects the VDDQ pad to the VDDQ main trunk line 421 is not directly connected to the VDDQ sub-trunk lines 851 to 853, it is possible to increase a time until an overvoltage applied to the VDDQ pad 144 is propagated to low voltage elements (internal elements) arranged in the cell region 1a (711) and the cell regions 1b (712) and (713) to which power supply potentials from the VDDQ sub-trunk lines 851 to 853 are supplied, in comparison with the case where the first VDDQ plug line 431 is directly connected to the VDDQ sub-trunk lines 851 to 853, and it is possible to reduce a risk of the overvoltage being applied to the internal element and the internal element being subjected to electrostatic breakdown.

The configuration of the second embodiment shown in FIG. 8B differs from the that of the first embodiment shown in FIGS. 4A and 4B. The cell regions 1b (712) and (713) are arranged between the cell regions 2 (721), (722), and (723). Third plug lines (third VDDQ plug lines 861 and 862) are newly provided. Power is supplied to the cell regions 1b (712) and (713) via the pads (VDDQ0 pad 144), the first plug line (first VDDQ plug line 831), the main trunk line (VDDQ main trunk line 821), the second plug lines (second VDDQ plug lines 841 and 842), the sub-trunk lines (VDDQ sub-trunk lines 851, 852, and 853), and the third plug lines (third VDDQ plug lines 861 and 862).

The main power supply trunk line (VDDQ main trunk line 821) is arranged on the cell regions 1b (712) and (713), but power is not directly supplied from the main power supply trunk line (VDDQ main trunk line 821) to the cell regions 1b (712) and (713). That is, a contact hole which connects the cell regions 1b (712) and (713) to the main power supply trunk line (VDDQ main trunk line 821) is not arranged.

In FIGS. 8A and 8B, the VSSQ wiring and the VDDQ wiring are shown in the separate drawings, but both the VSSQ wiring and the VDDQ wiring are actually formed in the data-system peripheral circuit arrangement region. Preferably, the VSSQ main trunk line 621, the VDDQ main trunk line 821, the VSSQ sub-trunk lines 651, 652, and 653, and VDDQ sub-trunk lines 851, 852, and 853 are formed on the same wiring layer, and the second VSSQ plug line 641, the first VSSQ plug lines 631 and 632, the third VSSQ plug lines 661 and 662, the second VDDQ plug lines 841 and 842, the first VDDQ plug line 831, and the third VDDQ plug lines 861 and 862 are formed on the same wiring layer. The VSSQ main trunk line 621 is insulated from the VDDQ main trunk line 821 and formed to extend along the VDDQ main trunk line 821. Likewise, the VSSQ sub-trunk lines 651, 652, and 653 are insulated from the VDDQ sub-trunk lines 851, 852, and 853, and are formed to extend along the VDDQ sub-trunk lines 851, 852, and 853.

Third Embodiment

Figure 9:
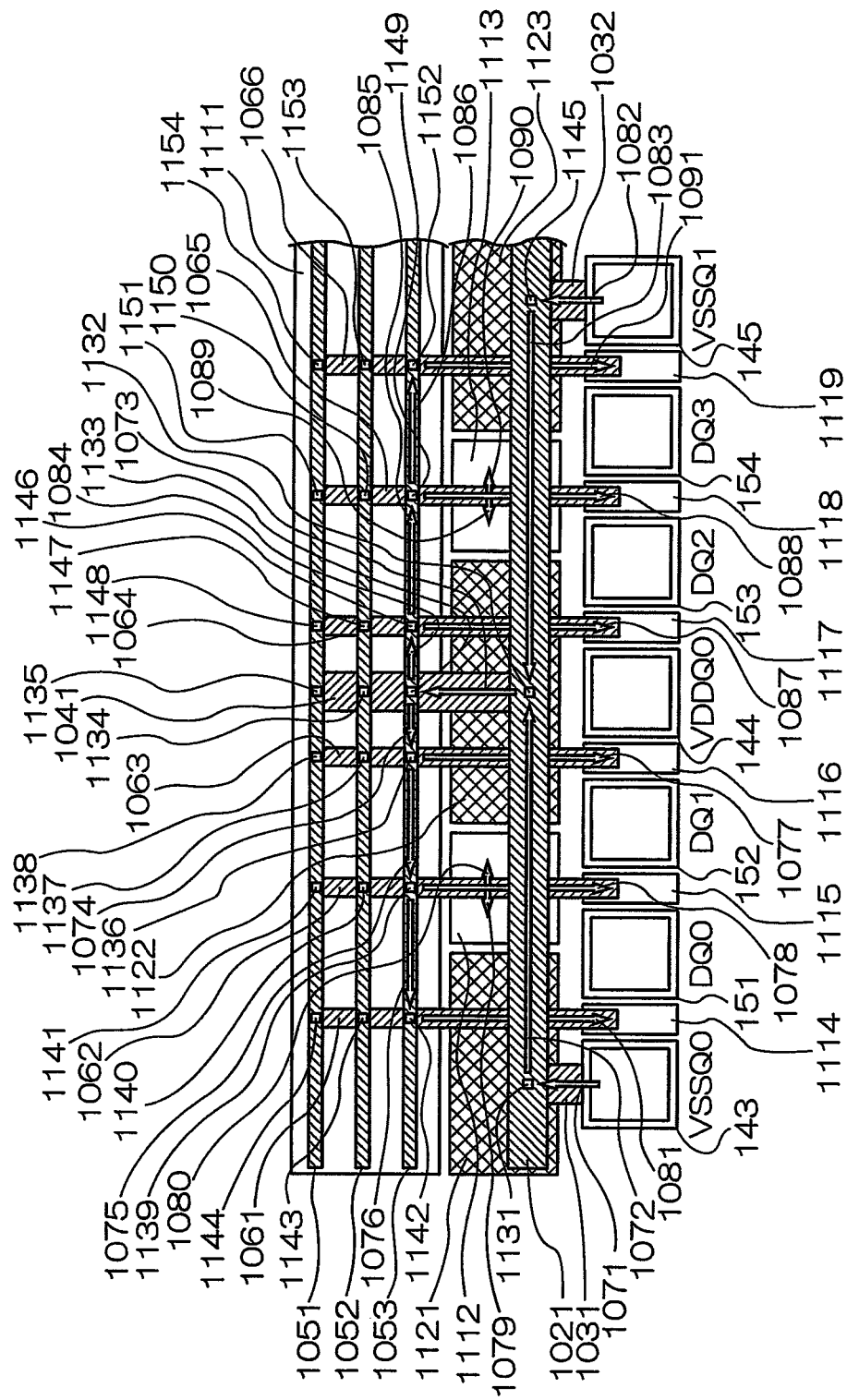
FIG. 9 is a schematic plan view illustrating a configuration of a data-system peripheral circuit region in a third embodiment of the present invention.
Figure 10:
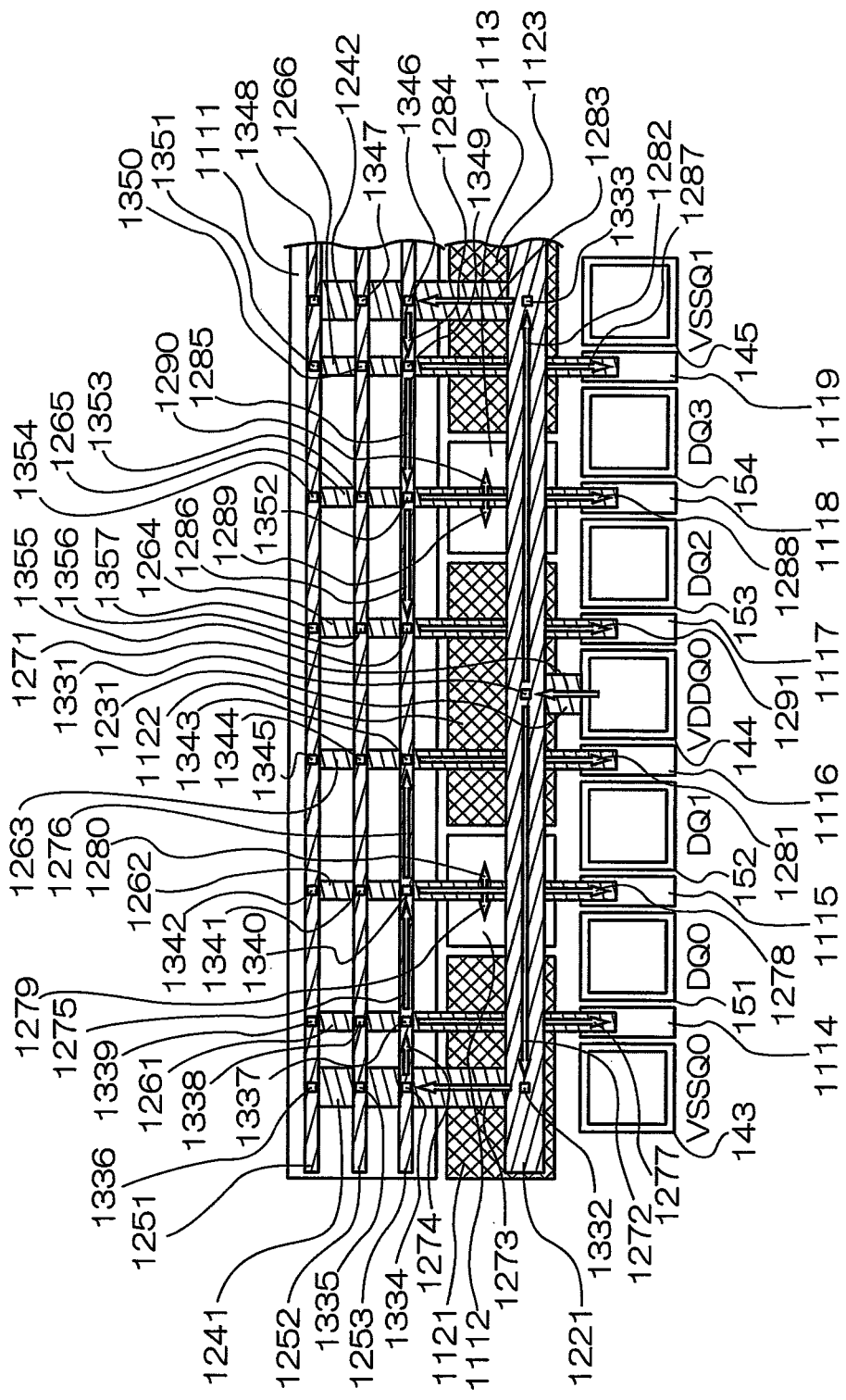
FIG. 10 is a schematic plan view illustrating a configuration of a data-system peripheral circuit region in the third embodiment of the present invention.

A third embodiment of the present invention will be described with reference to FIGS. 9 and 10. FIGS. 9 and 10 are schematic plan views showing the configuration of the third embodiment of the present invention, and are schematic plan views of the layout within the data-system peripheral circuit arrangement region 221 of FIG. 2. FIG. 9 shows a VSSQ wiring portion. FIG. 10 shows a VDDQ wiring portion.

FIG. 9 is a schematic plan view of a layout of a part within the data-system peripheral circuit arrangement region 221 corresponding to the partial region 311 of FIGS. 3A and 3B. In this case, in the region shown in FIG. 9, the cell region 2 corresponding to the cell region 2 (302) of FIGS. 3A and 3B is divided into a plurality of cell regions 2 (1121), (1122), and (1123), and the respective pads 143, 151, 152, 144, . . . are arranged to be distributed in an aligned direction. The cell region 1 includes a cell region 1a (1111) as a first cell region corresponding to the cell region 1 (301) of FIGS. 3A and 3B, a cell region 1b (1112) as a third cell region arranged between the cell regions 2 (1121) and (1122) corresponding to the cell regions 1b (712) and (713) newly added in the second embodiment, a cell region 1b (1113) as a third cell region arranged between the cell regions 2 (1122 and 1123), and cell regions 1c (1114), (1115), (1116), (1117), (1118), and (1119) as fourth cell regions interposed between the pads 143, 151, 152, 144, 153, 154, and 145 newly added in the third embodiment. The cell regions 1c (1114), (1115), (1116), (1117), (1118), and (1119) are arranged to be separated more than the cell regions 2 (1121), (1122), and (1123) from the cell region 1a (111) to the VSSQ0 pad 143 or the like.

A cell group (an output control unit, a level shift unit, an input buffer, compensation capacitance, and the like) using an low voltage element (internal element) (first, second, or third internal element) is arranged in the cell regions 1a (1111), 1b (1112), 1b (1113), and 1c (1114) to (1119). Ground potentials from the VSSQ sub-trunk lines 1051 to 1053, the third VSSQ plug line 1062 or 1065, or the fourth VSSQ plug line 1061, 1063, 1064, or 1066 are supplied to respective elements arranged in the cell regions 1a (1111), 1b (1112), 1b (1113), and 1c (1114) to (1119). The cell regions 2 (1121) to (1123) are arranged between DQ power supply pads (the VSSQ0 pad 143, the VDDQ0 pad 144, and the VSSQ1 pad 145) and the cell region 1a (1111) and extend in an extension direction of the cell region 1a (1111). A cell group (a power supply protection element, an input protection element, and an output buffer) using high voltage elements (a protection element and an output buffer) is arranged in the cell regions 2 (1121) to (1123). A ground potential from the VSSQ main trunk line 1021 is supplied to respective elements arranged in the cell regions 2 (1121) to (1123). The configuration of the low voltage element is the same as described with reference to FIG. 13B. A configuration example of the high voltage element having a higher voltage resisting characteristic property than the low voltage element is the same as described with reference to FIG. 13A.

In the region shown in FIG. 9, the VSSQ0 pad 143, the DQ0 pad 151, the DQ1 pad 152, the VDDQ0 pad 144, the DQ2 pad 153, the DQ3 pad 154, and the VSSQ1 pad 145 are aligned and arranged in the extension direction of the cell region 1a (1111) in this order. Here, the VSSQ0 pad 143 and the VSSQ1 pad 145 are respectively connected to the VSSQ0 terminal 243 and the VSSQ1 terminal 245, which are the power supply terminals for applying the ground potential of FIG. 1. The VDDQ0 pad 144 is connected to the VDDQ0 terminal 244, which is the power supply terminal for applying the power supply potential of FIG. 1.

The DQ0 pad 151, the DQ1 pad 152, the DQ2 pad 153, and the DQ3 pad 154 are connected to the DQ0 terminal 251, the DQ1 terminal 252, the DQ2 terminal 253, and the DQ3 terminal 254, which are the input/output terminals.

Three VSSQ sub-trunk lines 1051, 1052, and 1053 (having a longitudinal direction) extending in the extension direction of the cell region 1a (1111) are arranged in the cell region 1a (1111). One VSSQ main trunk line 1021 extending in the extension direction of the cell region 1a (1111) is arranged in the cell regions 2 (1121), (1122), and (1123). First VSSQ plug lines 1031 and 1032 which connect the VSSQ main trunk line 1021 to the VSSQ0 pad 143, and the VSSQ1 pad 145 via contact holes 1131 and 1145 are arranged in the cell regions 2 (1121), (1122), and (1123). A second VSSQ plug line 1041 which connects the three VSSQ sub-trunk lines 1051 to 1053 to the VSSQ main trunk line 1021 via contact holes 1132, 1133, 1134, and 1135 is arranged in the cell region 1a (1111).

Respective internal elements in the cell regions 1b (1112) and (1113) are respectively connected to the VSSQ sub-trunk lines 1051, 1052, and 1053 via the third VSSQ plug line 1062 or 1065. The third VSSQ plug lines 1062 and 1065 are respectively connected to the VSSQ sub-trunk lines 1051, 1052, and 1053 via contact holes 1139 to 1141 and 1149 to 1151.

Respective internal elements in the cell regions 1c (1114), (1115), (1116), (1117), (1118) and (1119) are respectively connected to the VSSQ sub-trunk line 1051, 1052, and 1053 via the fourth VSSQ plug line 1061, the third VSSQ plug line 1062, the fourth VSSQ plug line 1063, the fourth VSSQ plug line 1064, the third VSSQ plug line 1065, and the fourth VSSQ plug line 1066. The fourth VSSQ plug lines 1061, 1063, 1064, and 1066 are respectively connected to the VSSQ sub-trunk line 1051, 1052, and 1053 via the contact holes 1142 to 1144, 1136 to 1138, 1146 to 1148, and 1152 to 1153.

The respective wirings are wired by multiple layers, and the VSSQ main trunk line 1021 and the VSSQ sub-trunk lines 1051, 1052, and 1053 are formed on a wiring layer different from that of the second VSSQ plug line 1041, the first VSSQ plug lines 1031 and 1032, the third VSSQ plug lines 1062 and 1065, and the fourth VSSQ plug lines 1061, 1063, 1064, and 1066.

In the layout shown in FIG. 9, the potential applied to the VSSQ0 pad 143 is propagated to arrows 1071, 1072, 1073, 1074, 1084, and the like. Also, the potential is propagated from the arrow 1074 to arrows 1075 and 1077, from the arrow 1075 to arrows 1076 and 1078, from the arrow 1078 to arrows 1079 and 1080, and from the arrow 1076 to an arrow 1081 and the like. Also, the potential is propagated from the arrow 1084 to arrows 1085 and 1087, from the arrow 1085 to arrows 1086 and 1088, from the arrow 1088 to arrows 1089 and 1090, and from the arrow 1086 to an arrow 1091 and the like. The potential applied to the VSSQ1 pad 145 is propagated along a path indicated by arrows 1082, 1083, and 1073, and the like.

In the case of this layout configuration, the potential input to the VSSQ0 pad 143 is applied to the VSSQ sub-trunk lines 1051 to 1053 by a wiring portion having a longer wiring length than a straight line connecting between the VSSQ0 pad 143 and the VSSQ sub-trunk lines 1051 to 1053 at the shortest distance, as in the first embodiment. Accordingly, when an abnormal potential is applied to the VSSQ pad 143, it is possible to reduce a risk of the overvoltage being applied to low voltage elements (internal elements) arranged in the cell region 1a (1111), the cell regions 1b (1112) and (1113), and the cell regions 1c (1114), (1115), (1116), (1117), (1118), and (1119) before protection elements (not shown) (high voltage elements) within the cell regions 2 (1121), (1122), and (1123) are in the conductive state to discharge the abnormal potential from another VSSQ pad via the common discharge line 501. That is, since the first VSSQ plug lines 1031 and 1032 which connect the VSSQ pad to the VSSQ main trunk line 1021 are not directly connected to the VSSQ sub-trunk lines 1051 to 1053, it is possible to increase a time until an overvoltage applied to the VSSQ pad 143 is propagated to low voltage elements (internal elements) arranged in the cell regions 1c (1114), (1115), (1116), (1117), (1118), and (1119) to which ground potentials from the VSSQ sub-trunk lines 1051 to 1053 are supplied, in comparison with the case where the first VSSQ plug lines 1031 and 1032 are directly connected to the VSSQ sub-trunk lines 1051 to 1053, and it is possible to reduce a risk of the overvoltage being applied to the internal elements and the internal elements being subjected to electrostatic breakdown.

The configuration of the third embodiment shown in FIG. 9 differs from the configuration of the second embodiment shown in FIG. 8A. The cell regions 1c (1114) to (1119) are arranged between pads (pads 143, 151, 152, 144, 153, 154, and 145). Third plug lines (third VSSQ plug lines 1062 and 1065) extend. Fourth plug lines (fourth VSSQ plug lines 1061, 1063, 1064, and 1066) are newly provided. Power is supplied to the cell regions 1c (1114) to (1119) via the pads (VSSQ0 pad 143 and VSSQ1 pad 145), the first plug lines (first VSSQ plug lines 1031 and 1032), the main trunk line (VSSQ main trunk line 1021), the second plug line (second VSSQ plug line 1041), the sub-trunk lines (VSSQ sub-trunk lines 1051, 1052, and 1053), the third plug lines (third VSSQ plug lines 1062 and 1065) or fourth plug lines (fourth VSSQ plug lines 1061, 1063, 1064, and 1066).

According to the third embodiment, the cell regions 1c (1114) to (1119) are arranged between pads (pads 143, 151, 152, 144, 153, 154, and 145), and potentials are supplied from sub-trunk lines (VSSQ sub-trunk lines 1051, 1052, and 1053) to the cell regions 1c (1114) to (1119) by third or fourth VSSQ plug lines (third VSSQ plug lines 1062 and 1065 or fourth VSSQ plug lines 1061, 1063, 1064, and 1066). Thus, it is possible to arrange an internal element as a low electrostatic voltage element between pads and reduce a chip size.

FIG. 10 is a schematic plan view of a layout of a part in the data-system peripheral circuit arrangement region 221 corresponding to a partial region of FIG. 9, particularly, a VDDQ wiring. In FIG. 10, the same elements as shown in FIG. 9 are denoted by the same reference numerals.

In FIG. 10, power supply potentials are supplied from the VDDQ sub-trunk lines 1251 to 1253, the third VDDQ plug line 1262 or 1265, or the fourth VDDQ plug line 1261, 1263, 1264, or 1266 to respective elements arranged in the cell regions 1a (1111), 1b (1112), 1b (1113), and 1c (1114) to (1119). Also, a power supply potential from a VDDQ main trunk line 1021 is supplied to respective elements arranged in the cell regions 2 (1121) to (1123).

The configuration of the low voltage element is the same as described with reference to FIG. 13B. A configuration example of the high voltage element having a higher voltage resisting characteristic property than the low voltage element is the same as described with reference to FIG. 13A.

Three VDDQ sub-trunk lines 1251, 1252, and 1253 (having a longitudinal direction) extending in the extension direction of the cell region 1a (1111) are arranged in the cell region 1a (1111). One VDDQ main trunk line 1121 extending in the extension direction of the cell region 1a (1111) is arranged in the cell regions 2 (1121), (1122), and (1123). A first VDDQ plug line 1231 which connects the VDDQ main trunk line 1221 to the VDDQ0 pad 144 via a contact hole 1331 is arranged in the cell regions 2 (1121), (1122), or (1123).

A second VDDQ plug line 1241 which connects the three VSSQ sub-trunk lines 1251 to 1253 to the VDDQ main trunk line 1221 via contact holes 1332, 1333, 1334, and 1335, and a second VDDQ plug line 1242 which connects the three VDDQ sub-trunk lines 1251 to 1253 to the VDDQ main trunk line 1221 via contact holes 1333, 1346, 1347, and 1348 are arranged in the cell region 1*a* (1111).

Respective internal elements in the cell regions 1*b* (1112) and (1113) are respectively connected to the VDDQ sub-trunk lines 1251, 1252, and 1253 via the third VDDQ plug line 1262 or 1265. The third VDDQ plug lines 1262 and 1265 are respectively connected to the VSSQ sub-trunk lines 1251, 1252, and 1253 via contact holes 1340 to 1342 and 1352 to 1354.

Respective internal elements in the cell regions 1*c* (1114), (1115), (1116), (1117), (1118), and (1119) are respectively connected to the VDDQ sub-trunk lines 1251, 1252, and 1253 via the fourth VDDQ plug line 1261, the third VDDQ plug line 1262, the fourth VDDQ plug line 1263, the fourth VDDQ plug line 1264, the third VDDQ plug line 1265, and the fourth VDDQ plug line 1266. The fourth VDDQ plug lines 1261, 1263, 1264, and 1266 are respectively connected to the VDDQ sub-trunk line 1251, 1252, and 1253 via the contact holes 1337 to 1339, 1343 to 1345, 1355 to 1357, and 1349 to 1351.

The respective wirings are wired by multiple layers, and the VDDQ main trunk line 1221 and the VDDQ sub-trunk lines 1251, 1252, and 1253 are formed on a wiring layer different from that of the second VDDQ plug lines 1241 and 1242, the first VDDQ plug line 1231, the third VDDQ plug lines 1262 and 1265, and the fourth VDDQ plug line 1261, 1263, 1264, and 1266.

In the layout shown in FIG. 10, the potential applied to the VDDQ0 pad 144 is propagated along a path indicated by arrows 1271, 1272, 1273, 1274, and the like. The potential is propagated from the arrow 1274 to arrows 1275 and 1277, from the arrow 1275 to arrows 1276 and 1278, from the arrow 1278 to arrows 1279 and 1280, from the arrow 1276 to an arrow 1281 and the like. The potential applied to the VDDQ0 pad 144 is propagated to arrows 1271, 1282, 1283, 1284, and the like. The potential is propagated from the arrow 1284 to arrows 1285 and 1287, from the arrow 1285 to arrows 1286 and 1288, from the arrow 1288 to arrows 1289 and 1290, and from the arrow 1286 to an arrow 1291 and the like.

In the case of this layout configuration, the potential input to the VDDQ0 pad 144 is applied to the VDDQ sub-trunk lines 1251 to 1253 by a wiring portion having a longer wiring length than a straight line connecting between the VDDQ0 pad 144 and the VDDQ sub-trunk lines 1251 to 1253 at the shortest distance, as in the first embodiment. Accordingly, when an abnormal potential is applied to the VDDQ pad 144, it is possible to reduce a risk of the overvoltage being applied to low voltage elements (internal elements) arranged in the cell region 1*a* (1111), the cell regions 1*b* (1112) and (1113), and the cell regions 1*c* (1114), (1115), (1116), (1117), (1118) and (1119) before protection elements (not shown) (high voltage elements) within the cell regions 2 (1121), (1122), and (1123) are in the conductive state to discharge the abnormal potential from the VSSQ pad via the common discharge line 501.

That is, since the first VDDQ plug line 1231 which connects the VDDQ pad to the VDDQ main trunk line 1221 is not directly connected to the VDDQ sub-trunk lines 1251 to 1253, it is possible to increase a time until the overvoltage applied to the VDDQ0 pad 144 is propagated to the low voltage elements (the internal elements) arranged in the cell regions (1114), (1115), (1116), (1117), (1118), and (1119) to which power supply potentials from the VDDQ sub-trunk lines 1051 to 1053 are supplied, in comparison with the case where the first VDDQ plug line 1231 is directly connected to the VDDQ sub-trunk lines 1251 to 1253, and it is possible to reduce a risk of an overvoltage being applied to the internal element and the internal element being subjected to electrostatic breakdown.

The configuration of the third embodiment shown in FIG. 10 differs from the configuration of the second embodiment shown in FIG. 8B. The cell regions 1*c* (1114) to (1119) are arranged between pads (pads 143, 151, 152, 144, 153, 154, and 145). Third plug lines (third VDDQ plug lines 1262 and 1265) extend. Fourth plug lines (fourth VDDQ plug lines 1261, 1263, 1264, and 1266) are newly provided. Power is supplied to the cell regions 1*c* (1114) to (1119) via the pads (VSSQ0 pad 143 and VSSQ1 pad 145), the first plug line (first VDDQ plug line 1231), the main trunk line (VDDQ main trunk line 1221), the second plug lines (second VDDQ plug lines 1241 and 1242), the sub-trunk lines (VDDQ sub-trunk lines 1251, 1252, and 1253), the third plug lines (third VDDQ plug lines 1262 and 1265) or the fourth plug lines (fourth VDDQ plug lines 1261, 1263, 1264, and 1266).

In FIGS. 9 and 10, the VSSQ wiring and the VDDQ wiring are shown in the separate drawings, but both the VSSQ wiring and the VDDQ wiring are actually formed in the data-system peripheral circuit arrangement region. Preferably, the VSSQ main trunk line 1021, the VDDQ main trunk line 1221, the VSSQ sub-trunk lines 1051, 1052, and 1053, and the VDDQ sub-trunk lines 1251, 1252, and 1253 are formed on the same wiring layer, and the second VSSQ plug line 1041, the first VSSQ plug lines 1031 and 1032, the third VSSQ plug lines 1062 and 1065, and the fourth VSSQ plug lines 1061, 1063, 1064, and 1066 are formed on the same wiring layer as that of the second VDDQ plug lines 1241 and 1242, the first VDDQ plug line 1231, the third VDDQ plug lines 1262 and 1265, and the fourth VDDQ plug lines 1261, 1263, 1264, and 1266. The VSSQ main trunk line 1021 is insulated from the VDDQ main trunk line 1221 and formed to extend along the VDDQ main trunk line 1221. Likewise, the VSSQ sub-trunk lines 1051, 1052, and 1053 are insulated from the VDDQ sub-trunk lines 1251, 1252, and 1253, and are formed to extend along the VDDQ sub-trunk lines 1251, 1252, and 1253.

According to each embodiment of the present invention, power supply pads such as a VSSQ pad and a VDDQ pad and the corresponding power supply sub-trunk lines such as VSSQ and VDDQ are connected by the wiring portion (for example, a wiring portion including the first VSSQ plug line 331, (a part of) the VSSQ main trunk line 321, and the second VSSQ plug line 341 in the first embodiment) which has a longer wiring length than a shortest distance and applies the potential input to the power supply pad to the power sub-trunk line, instead of being connected at the shortest distance between the power pad and the power supply sub-trunk line. That is, a corresponding first VSSQ plug line and a corresponding first VDDQ plug line which connect power supply pads such as the VSSQ pad and the VDDQ pad to a corresponding VSSQ main trunk line and a corresponding VDDQ main trunk line are not directly connected to a corresponding VSSQ sub-trunk line and a corresponding VDDQ sub-trunk line. Thus, it is possible to reduce a risk of an overvoltage being applied to an internal element having the voltage resisting characteristic property of low voltage connected to the power supply sub-trunk line in comparison with the case where a power supply pad and a power supply sub-trunk line are connected at a shortest distance.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a first pad;
a sub-trunk line elongated in a first direction;
a main-trunk line arranged between the first pad and the sub-trunk line and elongated in the first direction;
a first plug line elongated in a second direction crossing the first direction and connecting the first pad to the main-trunk line, the first plug line extending from the first pad to a first portion of the main-trunk line and terminating at the first portion of the main-trunk line to have no part connected to the sub-trunk line;
a second plug line elongated in the second direction, the second plug line extending from a second portion of the main-trunk line to the sub-trunk line, the second portion of the main-trunk line being distant from the first portion of the main-trunk line; and
a first element coupled to the sub-trunk line.

2. The semiconductor device according to claim 1, wherein the first element is arranged at a position substantially on a line extending from the first plug line, and the first element is free from a contact to the first plug line.

3. The semiconductor device according to claim 1, further comprising: a common discharge line connected to the first plug line, and a protection element connected between the first plug line and the common discharge line.

4. The semiconductor device according to claim 3, wherein a time constant of a first path from the first pad to the first element is greater than a time period from receiving an overvoltage to discharging the overvoltage through the protection element and the common discharge line.

5. The semiconductor device according to claim 3, wherein when an overvoltage is received at the first pad, the overvoltage is discharged through the protection element to the common discharge line without being supplied to the first element.

6. The semiconductor device according to claim 1, wherein the first pad comprises one of a power pad and a ground pad.

7. A semiconductor device comprising:
first and second pads arranged in a first direction;
a first cell region being elongated in the first direction;
a second cell region arranged between the first and second pads and the first cell region, the second cell region being elongated in the first direction;
a sub-trunk line formed in the first cell region, the sub-trunk line being elongated in the first direction;
a main-trunk line formed in the second cell region, the main-trunk line being elongated in the first direction;
a first plug line extending in a second direction substantially perpendicular to the first direction and connecting the first pad to the main-trunk line at a first connecting point on the main-trunk line, the first plug line terminating in the second cell region to have no extension portion that is connected to the sub-trunk line;
a second plug line extending in the second direction and connecting the second pad to the main-trunk line at a second connecting point on the main-trunk line, the second connecting point being distanced from the first connecting point, the second plug line terminating in the second cell region to have no extension portion that is connected to the sub-trunk line; and
a third plug line extending in the second direction and connecting the sub-trunk line to the main-trunk line at a third connecting point on the main-trunk line, the third connecting point being positioned between the first connecting point and the second connecting point, the third connecting point being distanced from the first connecting point and from the second connecting point, the third plug line terminating at the third connecting point on the main-trunk line,
wherein each of the first and second connecting points is connected through the third plug line to the sub-trunk line.

8. The semiconductor device according to claim 7, wherein each of the first and second connecting points is connected to the sub-trunk line at a non-shortest distance.

9. The semiconductor device according to claim 7, wherein a first length of the main-trunk line, being defined between the first connecting point and the third connecting point, is substantially equal in length to a second length of the main-trunk line, being defined between the second connecting point and the third connecting point.

10. The semiconductor device according to claim 7, further comprising:
a plurality of third pads between the first pad and the second pad, and
wherein the first and second pads are one of a power pad and a ground pad, and the third pad is a signal pad.

11. A semiconductor device comprising:
a first pad;
a first cell region including a first element that has a first voltage resisting characteristic, the first cell region being elongated in a first direction;
a second cell region arranged between the first pad and the first cell region, the second cell region including a second element that has a second voltage resisting characteristic, the second voltage resisting characteristic being higher in voltage level than the first voltage resisting characteristic, the second cell region being elongated in the first direction; and
a sub-trunk line formed in the first cell region, the sub-trunk line being elongated in the first direction and connected to the first element;
a main-trunk line formed in the second cell region, the main-trunk line being elongated in the first direction and connected to the second element, the main-trunk line having first and second parts that are separate from each other;
a first plug line extending in the second direction crossing the first direction, the first plug line including a first end portion that contacts a part of the sub-trunk line and a second end portion that contacts the first part of the main-trunk line; and
a second plug line extending in the second direction, the second plug line including a third end portion that contacts the first pad and a fourth end portion that contacts the second part of the main-trunk line, the second plug line terminating in the second cell region to have no extension portion that reaches and connects to the sub-trunk line.

12. The semiconductor device according to claim 11, further comprising: a plurality of additional sub-trunk lines in the first cell region.

13. The semiconductor device according to claim 11, wherein the first pad comprises one of a power pad and a ground pad.

\* \* \* \* \*